(12) United States Patent
Uzoh et al.

(10) Patent No.: US 9,793,198 B2
(45) Date of Patent: Oct. 17, 2017

(54) CONDUCTIVE CONNECTIONS, STRUCTURES WITH SUCH CONNECTIONS, AND METHODS OF MANUFACTURE

(71) Applicant: Invensas Corporation, San Jose, CA (US)

(72) Inventors: Cyprian Emeka Uzoh, San Jose, CA (US); Rajesh Katkar, San Jose, CA (US)

(73) Assignee: INVENSAS CORPORATION, San Jose, CA (US)

( * ) Notice: Subject to any disclaimer, the term of this patent is extended or adjusted under 35 U.S.C. 154(b) by 208 days.

(21) Appl. No.: 14/275,519

(22) Filed: May 12, 2014

(65) Prior Publication Data

US 2015/0325507 A1    Nov. 12, 2015

(51) Int. Cl.
*H01L 23/498* (2006.01)
*B23K 35/22* (2006.01)
(Continued)

(52) U.S. Cl.
CPC ...... *H01L 23/49811* (2013.01); *B23K 1/0016* (2013.01); *B23K 35/0244* (2013.01); *B23K 35/0266* (2013.01); *B23K 35/22* (2013.01); *B32B 15/01* (2013.01); *H01L 21/4853* (2013.01); *H01L 21/56* (2013.01); *H01L 21/563* (2013.01); *H01L 21/565* (2013.01); *H01L 23/3114* (2013.01); *H01L 23/3135* (2013.01);
(Continued)

(58) Field of Classification Search
CPC ... H05K 1/18; H01L 23/498; H01L 23/49811; H01L 35/22; H01L 24/03; H01L 25/05; H01L 23/49827; H01L 24/16; H01L 2224/03; H01L 21/02225; H01L 21/4853; H01L 21/56; H01L 21/563; H01L 21/565; H01L 23/3114; H01L 23/3135; H01L 23/49816; H01L 24/05; H01L 24/06; H01L 24/11; H01L 24/13; B23K 1/0016; B23K 35/0244; B23K 35/0266; B23K 35/22

See application file for complete search history.

(56) References Cited

U.S. PATENT DOCUMENTS

| 4,269,870 A | 5/1981 | Boynton |
| 5,062,896 A | 11/1991 | Huang et al. |

(Continued)

FOREIGN PATENT DOCUMENTS

| EP | 0 345 485 A1 | 5/1989 |
| EP | 0 895 281 A1 | 2/1999 |

(Continued)

OTHER PUBLICATIONS

Hayes, Donald J. et. al., "Low-Cost Display Assembly and Interconnect Using Ink-Jet Printing Technology," MicroFab Technologies Inc., Display Works '99, 4 pages.

(Continued)

*Primary Examiner* — William F Kraig
*Assistant Examiner* — Khatib Rahman
(74) *Attorney, Agent, or Firm* — Haynes and Boone, LLP

(57) ABSTRACT

A solder connection may be surrounded by a solder locking layer (1210, 2210) and may be recessed in a hole (1230) in that layer. The recess may be obtained by evaporating a vaporizable portion (1250) of the solder connection. Other features are also provided.

11 Claims, 12 Drawing Sheets

(51) Int. Cl.
  *B23K 35/02*  (2006.01)
  *B32B 15/01*  (2006.01)
  *H01L 23/31*  (2006.01)
  *H01L 21/48*  (2006.01)
  *H01L 21/56*  (2006.01)
  *H01L 23/00*  (2006.01)
  *H01L 25/065* (2006.01)
  *H01L 25/10*  (2006.01)
  *H01L 25/00*  (2006.01)
  *B23K 1/00*   (2006.01)
  *B23K 101/40* (2006.01)

(52) U.S. Cl.
  CPC .............. *H01L 24/03* (2013.01); *H01L 24/05* (2013.01); *H01L 24/06* (2013.01); *H01L 24/11* (2013.01); *H01L 24/13* (2013.01); *H01L 24/14* (2013.01); *H01L 24/16* (2013.01); *H01L 24/17* (2013.01); *H01L 24/19* (2013.01); *H01L 24/20* (2013.01); *H01L 24/24* (2013.01); *H01L 24/73* (2013.01); *H01L 24/742* (2013.01); *H01L 24/81* (2013.01); *H01L 24/82* (2013.01); *H01L 24/98* (2013.01); *H01L 25/0652* (2013.01); *H01L 25/0657* (2013.01); *H01L 25/105* (2013.01); *H01L 25/50* (2013.01); *B23K 2201/40* (2013.01); *H01L 24/83* (2013.01); *H01L 2224/03* (2013.01); *H01L 2224/03001* (2013.01); *H01L 2224/039* (2013.01); *H01L 2224/03009* (2013.01); *H01L 2224/0332* (2013.01); *H01L 2224/0333* (2013.01); *H01L 2224/0348* (2013.01); *H01L 2224/0391* (2013.01); *H01L 2224/03318* (2013.01); *H01L 2224/03848* (2013.01); *H01L 2224/03849* (2013.01); *H01L 2224/03901* (2013.01); *H01L 2224/04105* (2013.01); *H01L 2224/051* (2013.01); *H01L 2224/056* (2013.01); *H01L 2224/05022* (2013.01); *H01L 2224/05294* (2013.01); *H01L 2224/05547* (2013.01); *H01L 2224/05567* (2013.01); *H01L 2224/05573* (2013.01); *H01L 2224/05582* (2013.01); *H01L 2224/05794* (2013.01); *H01L 2224/05839* (2013.01); *H01L 2224/05844* (2013.01); *H01L 2224/05847* (2013.01); *H01L 2224/05855* (2013.01); *H01L 2224/0603* (2013.01); *H01L 2224/06102* (2013.01); *H01L 2224/10145* (2013.01); *H01L 2224/111* (2013.01); *H01L 2224/11001* (2013.01); *H01L 2224/11005* (2013.01); *H01L 2224/11009* (2013.01); *H01L 2224/119* (2013.01); *H01L 2224/1132* (2013.01); *H01L 2224/1134* (2013.01); *H01L 2224/1191* (2013.01); *H01L 2224/11318* (2013.01); *H01L 2224/11334* (2013.01); *H01L 2224/11848* (2013.01); *H01L 2224/11849* (2013.01); *H01L 2224/11901* (2013.01); *H01L 2224/131* (2013.01); *H01L 2224/133* (2013.01); *H01L 2224/13005* (2013.01); *H01L 2224/136* (2013.01); *H01L 2224/13017* (2013.01); *H01L 2224/13018* (2013.01); *H01L 2224/1319* (2013.01); *H01L 2224/13021* (2013.01); *H01L 2224/13022* (2013.01); *H01L 2224/13082* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/13294* (2013.01); *H01L 2224/13339* (2013.01); *H01L 2224/13344* (2013.01); *H01L 2224/13347* (2013.01); *H01L 2224/13355* (2013.01); *H01L 2224/13561* (2013.01); *H01L 2224/13562* (2013.01); *H01L 2224/13565* (2013.01); *H01L 2224/13609* (2013.01); *H01L 2224/13611* (2013.01); *H01L 2224/1403* (2013.01); *H01L 2224/16058* (2013.01); *H01L 2224/16059* (2013.01); *H01L 2224/16145* (2013.01); *H01L 2224/16147* (2013.01); *H01L 2224/16148* (2013.01); *H01L 2224/16227* (2013.01); *H01L 2224/16238* (2013.01); *H01L 2224/1701* (2013.01); *H01L 2224/1703* (2013.01); *H01L 2224/17181* (2013.01); *H01L 2224/17505* (2013.01); *H01L 2224/2101* (2013.01); *H01L 2224/211* (2013.01); *H01L 2224/2401* (2013.01); *H01L 2224/2402* (2013.01); *H01L 2224/24137* (2013.01); *H01L 2224/24146* (2013.01); *H01L 2224/2919* (2013.01); *H01L 2224/32145* (2013.01); *H01L 2224/73104* (2013.01); *H01L 2224/73204* (2013.01); *H01L 2224/73267* (2013.01); *H01L 2224/75253* (2013.01); *H01L 2224/8121* (2013.01); *H01L 2224/8122* (2013.01); *H01L 2224/81138* (2013.01); *H01L 2224/81141* (2013.01); *H01L 2224/81193* (2013.01); *H01L 2224/81203* (2013.01); *H01L 2224/81224* (2013.01); *H01L 2224/81815* (2013.01); *H01L 2224/82005* (2013.01); *H01L 2224/82101* (2013.01); *H01L 2224/82102* (2013.01); *H01L 2224/82105* (2013.01); *H01L 2224/8385* (2013.01); *H01L 2224/9211* (2013.01); *H01L 2225/06513* (2013.01); *H01L 2225/1023* (2013.01); *H01L 2225/1058* (2013.01); *H01L 2924/15192* (2013.01); *H01L 2924/15311* (2013.01); *H01L 2924/15321* (2013.01); *H01L 2924/3512* (2013.01); *H01L 2924/381* (2013.01); *H01L 2924/3841* (2013.01)

(56) References Cited

U.S. PATENT DOCUMENTS

| | | |
|---|---|---|
| 5,600,103 A | 2/1997 | Odaira et al. |
| 5,742,100 A * | 4/1998 | Schroeder ............ H01L 23/5384 |
| | | 257/737 |
| 5,855,323 A | 1/1999 | Yost et al. |
| 5,977,512 A | 11/1999 | Azdasht et al. |
| 6,050,481 A * | 4/2000 | Chapman ............. B23K 3/0623 |
| | | 228/180.22 |
| 6,162,660 A | 12/2000 | LaFontaine, Jr. et al. |
| 6,322,903 B1 | 11/2001 | Siniaguine et al. |
| 6,350,669 B1 * | 2/2002 | Pu ....................... H01L 21/4846 |
| | | 174/256 |
| 6,455,785 B1 | 9/2002 | Sakurai et al. |
| 6,635,209 B2 | 10/2003 | Huang |
| 6,838,637 B2 | 1/2005 | Song et al. |
| 7,144,745 B2 | 12/2006 | Badehi |
| 7,604,153 B2 | 10/2009 | MacKay et al. |
| 7,799,607 B2 | 9/2010 | Karashima et al. |
| 7,923,823 B2 | 4/2011 | Mengel et al. |
| 8,067,267 B2 | 11/2011 | Haba et al. |
| 8,222,538 B1 | 7/2012 | Yoshida et al. |
| 8,507,804 B2 | 8/2013 | MacDougall et al. |
| 8,618,659 B2 | 12/2013 | Sato et al. |
| 2002/0047212 A1 | 4/2002 | Chen |
| 2003/0038374 A1 * | 2/2003 | Shim .................... H01L 23/3128 |
| | | 257/777 |
| 2004/0000355 A1 * | 1/2004 | Suga .................... B23K 35/262 |
| | | 148/25 |
| 2004/0042181 A1 | 3/2004 | Nagasaki |
| 2004/0094600 A1 | 5/2004 | Zakel et al. |

(56) References Cited

U.S. PATENT DOCUMENTS

| | | | |
|---|---|---|---|
| 2004/0144834 | A1 | 7/2004 | Nauchi et al. |
| 2004/0149805 | A1 | 8/2004 | Ito |
| 2006/0219760 | A1 | 10/2006 | Wagoh |
| 2007/0102485 | A1 | 5/2007 | Fukaya et al. |
| 2008/0173988 | A1 | 7/2008 | Mengal et al. |
| 2009/0045523 | A1 | 2/2009 | Fan et al. |
| 2010/0148376 | A1 | 6/2010 | Karashima et al. |
| 2011/0068465 | A1* | 3/2011 | Shen ............... H01L 24/16 257/737 |
| 2011/0285013 | A1 | 11/2011 | Chuang et al. |
| 2013/0062757 | A1 | 3/2013 | Feger et al. |
| 2013/0099380 | A1 | 4/2013 | Chen |
| 2013/0130440 | A1 | 5/2013 | Hu et al. |
| 2013/0256277 | A1 | 10/2013 | Li et al. |
| 2014/0042608 | A1* | 2/2014 | Kim ............... H01L 23/04 257/686 |

FOREIGN PATENT DOCUMENTS

| | | |
|---|---|---|
| EP | 0 964 608 A2 | 12/1999 |
| JP | 2002 076043 A | 3/2002 |
| JP | 2006 339491 A | 12/2006 |
| WO | WO 95/00279 | 1/1995 |
| WO | WO 99/08498 A1 | 2/1999 |

OTHER PUBLICATIONS

Tarr, Martin, "Plastic encapsulation for semiconductors," www.ami.ac.uk/courses/topics/0269_pem/index.html, Retrieved Feb. 21, 2014, 19 pages.

Wikipedia, "Parylene," http://en.wikipedia.orp/wiki/Parylene, Retrieved Feb. 12, 2014, 6 pages.

Zakel, Elke et al., "High Speed Laser Solder Jetting Technology for Optoelectronics and MEMS Packaging," ICEP 2002, Publication 21, http://www.pactech.de/index.php?option=com_content&view=article&id=154&Itemid=21, Retrieved Dec. 26, 2013, 7 pages.

Winslow, Russell T., "Converting Ball Grid Array Components to Column Grid Array," Six Sigma, Tech Paper; Converting BGA Components to CGA, Presented at the Military, Aerospace, Space, and Homeland Security: Packaging Issues & Applications (MASH 2005) Workshop © 2006, 6 pages.

Xingsheng, Liu, "Processing and Reliability Assessment of Solder Joint Interconnection for Power Chips," PhD Dissertation dated Feb. 27, 2001, (URN etd-04082001-204805), Virginia Tech Digital Library, Chapter II, 48 pages.

U.S. Appl. No. 13/942,568 titled, "Microelectronic Assemblies with Stack Terminals Coupled by Connectors Extending Through Encapsulation," filed Jul. 15, 2013, 58 pages.

U.S. Appl. No. 14/275,514 titled, "Conductive Connections, Structures With Such Connections, and Methods of Manufacture," filed May 12, 2014, 42 pages.

International Search Report and Written Opinion for PCT/US2015/030413, dated Nov. 3, 2015.

International Search Report and Written Opinion for PCT/US2015/030410, dated Nov. 12, 2015.

PCT International Preliminary Examination Report from the International Searching Authority, for PCT Application PCT/US2015/030413, dated Nov. 24, 2016. 12 Pages.

* cited by examiner

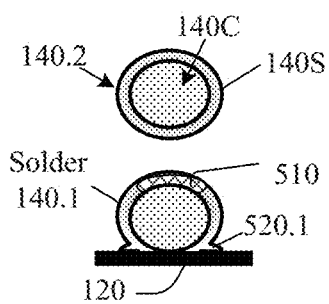 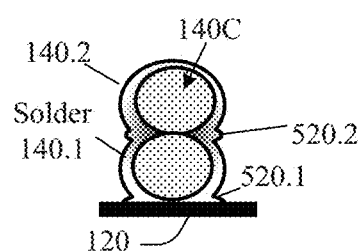
FIG. 11A  FIG. 11B
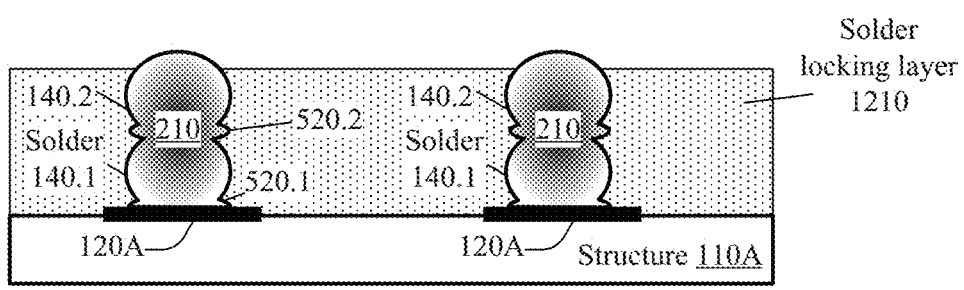
FIG. 12A
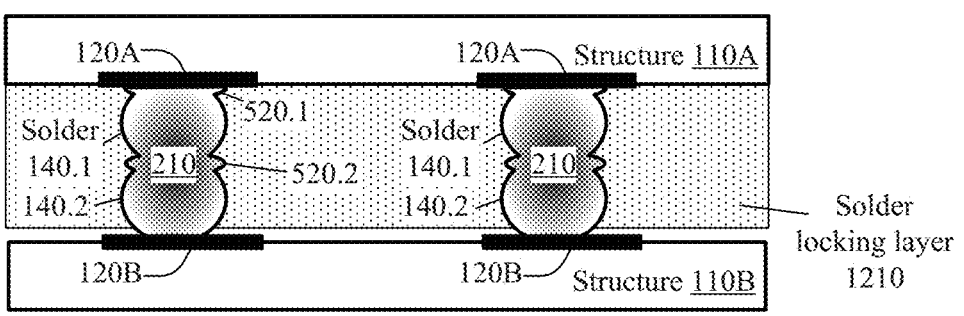
FIG. 12B

CONDUCTIVE CONNECTIONS, STRUCTURES WITH SUCH CONNECTIONS, AND METHODS OF MANUFACTURE

BACKGROUND OF THE INVENTION

The present disclosure relates to conductive connections such as solder connections. Such connections are used, for example, in packaging of semiconductor integrated circuits, and in particular in attaching an integrated circuit or a packaging substrate to another integrated circuit or substrate. Examples of packaging substrates include wiring substrates (e.g. printed circuit boards) and interposers.

Solder is widely used in such connections because, for example, a solder connection can be easily undone (by melting the solder) to repair or replace a defective component without replacing the entire package.

FIGS. 1A and 1B illustrate solder attachment of an integrated circuit 110A to a structure 110B. Structure 110B may be another integrated circuit, or a printed circuit board (PCB), or some other packaging substrate, or can be an integrated circuit package. Circuit 110A has electrical contacts ("contact pads") 120A which must be soldered directly to contact pads 120B of structure 110B. Such direct solder attachment is called "flip-chip" attachment. (Alternatively, contact pads can be interconnected by discrete wires, but flip-chip attachments are preferred because they reduce the assembly size and they lower the electrical resistance, parasitic capacitance, and parasitic inductance.)

As shown in FIG. 1A, solder balls 140 are formed on pads 120A. (The solder balls may alternatively be formed on pads 120B or on both pads 120A and 120B.) Then the structures 110A and 120B are brought together so that the solder 140 physically contacts the contact pads 120A and 120B. This assembly is placed into an oven to melt the solder. The solder then cools and re-solidifies to attach the pads 120A to the corresponding pads 120B.

During manufacture and subsequent circuit operation, solder connections 140 can be pulled sideways by various forces. A common source of such forces is thermal expansion: structures 110A, 110B may expand or contract due to heating or cooling, and the structure 110A may expand or contract by a different amount than the structure 110B if the two structures have different coefficients of thermal expansion (CTE). Solder connections 140 may crack or break, impairing or destroying the electrical functionality. Reliability of solder connections is thus an important goal in designing a manufacturing process.

Solder connections can be made more reliable by increasing their height H. However, increasing the height also increases the solder ball's width W because the solder tends to become spherical when melted. As a result, adjacent pads 120A must be spaced farther apart so as not to be shorted to each other. The minimal distance between pads 120B is also increased. Of note, the distance between the centers of adjacent pads 120 cannot be smaller than the distance between the centers of the adjacent solder balls, i.e. the solder ball pitch; the pitch is therefore greater than or equal to W. The increased pitch undesirably increases the assembly size and may degrade the electrical functionality (for example, by requiring longer interconnect lines (not shown) and/or by making the circuit slower and/or more power-hungry).

Thus, it is desirable to increase the height H without the corresponding increase in W, i.e. to increase the ratio H/W (this ratio is about equal to the height-to-pitch ratio because the solder ball width W is about equal to the minimal solder ball pitch). In order to increase this ratio, a solder connection can be made as a stack of solder balls. FIG. 2 illustrates a stack 210 of four solder balls 140.1, 140.2, 140.3, 140.4 on a contact pad 120 of a structure 110. The stack can be produced by a solder jetting apparatus 220 of type $SB^2$-Jet available from Pac Tech (Packaging Technologies USA, Inc.). See e.g. E. Zakel et al., "High Speed Laser Solder Jetting Technology for Optoelectronics and MEMS Packaging", ICEP 2002, incorporated herein by reference. In this apparatus, melted or at least softened solder balls 140 are supplied one after another through a nozzle 240. Gas pressure is used to propel and place each solder ball on top of contact pad 120 or of another, previously placed solder ball. As each solder ball is being placed, the solder ball is melted by a laser source 250 and is then cooled to adhere to the contact pad 120 or the underlying solder ball. Solder stack 210 does indeed have a higher H/W ratio than a single solder ball, but the H/W increase is limited because the solder balls 140 are squashed (flattened) in the jetting process. The flattening acts to increase W and decrease H. For example, if each solder ball 140 has the same volume as a sphere of radius 250 μm, then the stack of two solder balls 140.1, 140.2 may have the height H of only 400 μm or less, not 500 μm. The solder ball width W is higher than 250 μm, so the height-to-pitch ratio is smaller than 400/250=1.6 for the two-ball stack, or smaller than 0.8 per ball.

After solder stack formation, the structure 110 is attached to another structure (as in FIG. 1B). In this structure-to-structure attachment, the solder stack is reflowed (melted), and the ratio H/W may further decrease during reflow. For example, a 450 μm diameter solder ball may become only 360 μm high, requiring a pad-to-pad pitch of about 600 μm (unless the solder is laterally restrained by a mask, not shown). The entire solder stack may even collapse. To counteract this phenomenon, one of the balls 140 can be made of a high-melting-temperature material having a higher melting temperature than the other balls so as not to melt during the structure-to-structure attachment. Such a technique is described in U.S. Pat. No. 6,455,785 issued Sep. 24, 2002 to Sakurai et al. In that technique, the bottom balls 140.1 are made of gold, and the overlying balls of indium (indium has a lower melting temperature than gold). Each ball is formed by heating a tip of a metal wire (gold or indium wire, heated by a high voltage discharge or a gas flame): the molten tip forms a ball which is placed on the structure, and the wire is then cut off. A wire residue remains as a small protrusion on top of the ball, and these protrusions are flattened by a plate pressing on the balls. Then, in the structure-to-structure attachment, only the indium balls are reflowed, the gold ball remains solid to prevent collapse.

FIGS. 3A, 3B illustrates another bumping technique from a PhD Dissertation by Xingshen Liu entitled "Processing and Reliability Assessment of Solder Joint Interconnection for Power Chips", PhD Dissertation, 2001 (URN etd-04082001-204805), Virginia Tech Digital Library, Chapter II, incorporated herein by reference. First, solder balls 140.1 are formed on contacts 120A from solder paste. Then higher-melting-temperature balls 140.2 are placed on balls 140.1, and solder 140.1 is reflowed. Balls 140.2 are never melted. Solder balls 140.3 are formed on contact pads 120B of another structure 110B from solder paste. Solder 140.3 has lower melting temperature than 140.1. Then structure 110A is placed on structure 110B, and the solder 140.3 is reflowed for attachment to solder 140.2. Solders 140.1 and 140.2 are not melted in this process.

Further improvements are desirable in forming conductive connections.

SUMMARY

This section summarizes some of the exemplary implementations of the invention.

In some embodiments for forming a solder connection, only a portion of the solder ball's surface is melted. The height-to-pitch ratio is therefore increased in some embodiments, or at least is less likely to decrease. For example, in some embodiments, the height-to-width ratio H/W is greater than 0.8 per solder ball, and can be 1 or close to 1. This technique can be used to form solder stacks, but can also be used to form single-ball connections (i.e. connections having only one solder ball as in FIG. 1B).

A solder connection may include non-solder components, e.g. solder-coated balls having a non-solder core which does not melt at any stage (the core can be a high-melting-temperature metal and/or a polymer and/or an insulator).

In some embodiments, a solder or non-solder connection (e.g. a copper post) is recessed at the top in a surrounding dielectric layer in a structure 110A. Another structure (e.g. 110B) has a protruding conductive post which is inserted into the recess and bonded to the connection. The recess helps align the connection of structure 110A with the post of structure 110B. Also, if solder is used, the recess restrains the solder and thus helps to avoid an electrical short with nearby connections. Restraining the solder also strengthens the bond between the connection and the post because if the solder is not restrained then it flows away and is wasted. Other embodiments and variations are within the scope of the invention as defined by the appended claims.

BRIEF DESCRIPTION OF THE DRAWINGS

FIGS. 4A, 4B, 4C, 5A, 5B, 6A, 6B, 7, 8, 9, 10, 11A, 11B, 12A, 12B, 13, 14A, 14B, 14C, 15, 16A, 16B, 17A, 17B, 18, 19A, 19B, 20, 21A, 21B, 21C, 21D, 22, 23, 24, 25, 26, 27, 28, 29, 30, 31, 32 show vertical cross sections of structures during and after fabrication according to certain embodiments set forth in further detail below.

DESCRIPTION OF SOME EMBODIMENTS

The embodiments described in this section illustrate but do not limit the invention. The invention is defined by the appended claims.

Figure 1A:
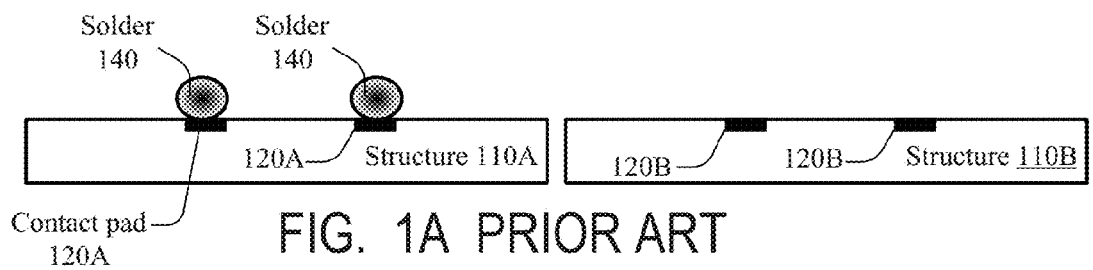
FIGS. 1A, 1B, 2, 3A, 3B show vertical cross sections of structures during and after fabrication according to prior art.
Figure 1B:
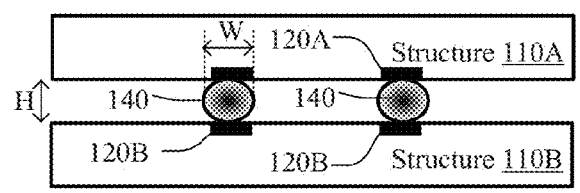
Figure 2:
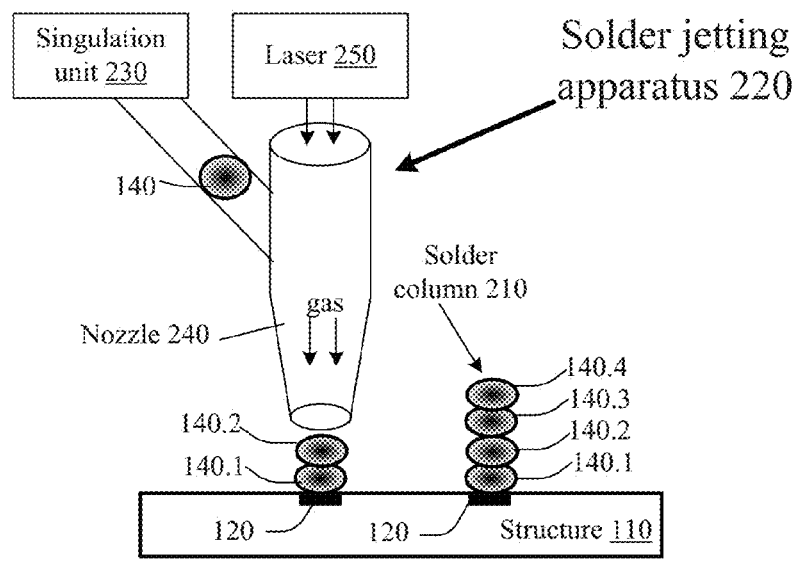
Figure 3A:
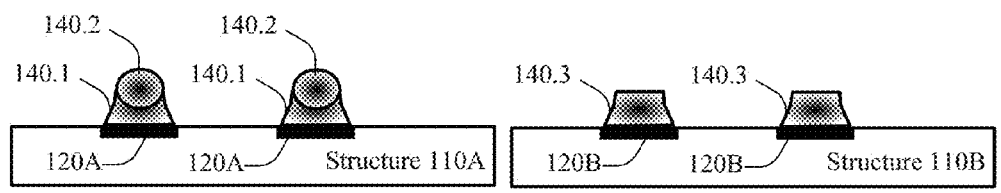
Figure 3B:
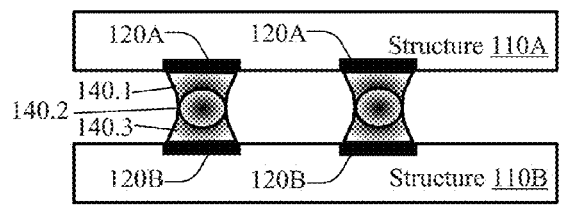
Figure 4A:
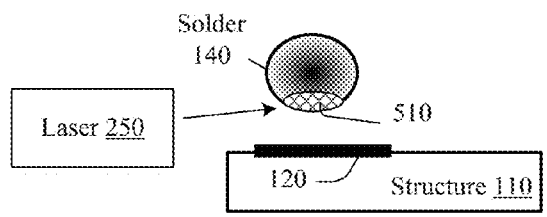
Figure 4B:
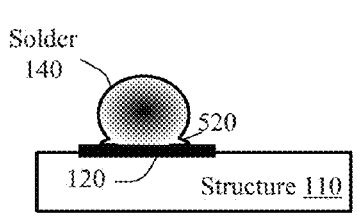

FIGS. 4A, 4B illustrate attachment of a solder ball 140 to contact pad 120 according to some embodiments. Structure 110 can be an integrated circuit, an interposer, a rigid or flexible wiring substrate, and/or of any type described above for structures 110, 110A, 110B, and/or a combination of the types described above (e.g. a package). Contact pad 120 is shown at the top surface of structure 110, but can be at any surface: the invention is not limited to any special orientation. Solder 140 is melted only at its bottom region 510. The rest of solder 140 is not melted during the attachment, so the solder ball's height is more stable. The melting can be performed by heat supplied by electromagnetic radiation, for example by a laser pencil 250. In some embodiments, laser 250 emits a pulse of infrared radiation (e.g. 1064 nm wavelength) of 1 µsec to a few milliseconds in duration, but the invention is not limited to any pulse durations, wavelengths, or other parameters. However, the pulse and other parameters are chosen so as not to melt the rest of the solder ball. Suitable parameters depend on the solder material, the size of region 510, and possibly other factors, and such parameters can be experimentally determined without undue experimentation. See for example U.S. Pat. No. 5,977,512 issued Nov. 2, 1999 to Azdasht et al. describing laser parameters for melting an entire solder ball; this patent is incorporated herein by reference. In some embodiments, the laser beam is focused by appropriate optics. Focused or unfocused non-laser light can also be used. The light beam can arrive at area 510 from a side as in FIG. 4A, or from another direction; in some embodiments, the light source is positioned below the structure 110, and the light beam travels through the structure to region 510. The invention is not limited to a particular source of heating energy, or a position of the source, or other parameters.

In some embodiments, the melted region 510 is at most 50% of the volume of solder 140 (the volume is taken before melting). In some embodiments, region 510 is 1% to 50% of the entire volume. In some of these embodiments, the solder ball is between 5 µm and 1 µm in diameter (the diameter is the maximum pre-melted dimension: the solder ball may or may not be perfectly round). For example, the diameter can be from 25 µm to 500 µm, possibly not more than 250 µm, possibly not more than 175 µm. These ranges are not limiting. In some embodiments, region 510 is a surface region whose depth is below 50%, or even below 25%, or below 10% of the solder ball's pre-melted or melted or post-melted diameter or height.

Solder ball 140 is placed on contact pad 120 so that the region 510 is in physical contact with the pad. The heating energy is supplied to region 510 before and/or after the solder ball placement. Then region 510 is cooled and re-solidified to fuse the solder ball to the contact pad. Contact pad 120 is not melted in the fusing process. The placing of solder 140 on pad 120 can be effected by any suitable means, possibly using conventional methods such as solder jetting, or such as forcing the solder 140 through a stencil's opening aligned with pad 120 (the solder could be forced by a squeegee, a piston, gas, possibly just by its own weight, or other suitable force). Other placement methods can also be used.

In some embodiments, in the fusing process, some of the molten or softened solder is squeezed out due to the weight of solder 140 and/or due to additional pressure that may be applied to the solder ball and/or the contact pad (e.g. by gas or squeegee etc.). The "squeeze-out" region 520 (FIG. 4B) protrudes laterally outward at the junction of solder 140 and contact pad 120. In some embodiments, region 520 is a continuous protrusion that protrudes laterally on all sides of solder connection 140. Region 520 may or may not be perfectly round.

Figure 4C:
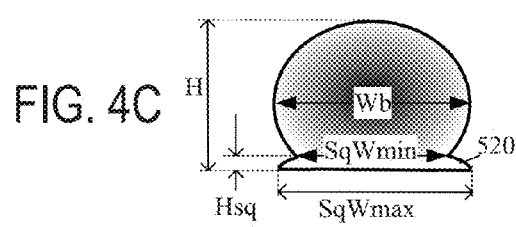

FIG. 4C is an enlarged view of solder 140. The shape of squeeze-out 520 depends on the size and temperature of region 510, the pressure applied to ball 140, and possibly other parameters. In some embodiments, the pre-melted height Hsq of squeeze-out 520 is about 1% to 50% of height H of solder 140. In some embodiments, the depth of region 510 is less than 50% of the solder ball diameter, so Hsq is less than 50% of H. The maximum squeeze-out width SqWmax is from 1% to 150% of the width Wb of the solder portion above the squeeze-out. The solder width SqWmin at the top end of the squeeze-out is from 1% to 100% of the non-squeeze-out solder width Wb.

As noted above, the invention is not limited to any special orientation. For example, at any stage of the attachment process or subsequently, solder 140 can be below the contact pad or in some other orientation.

Figure 5A:
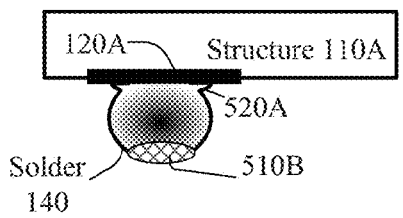
Figure 5B:
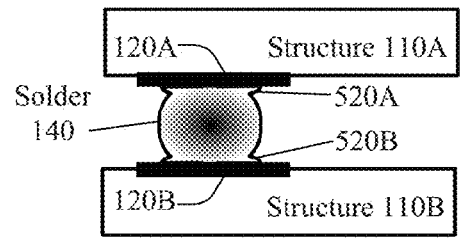

In FIGS. 5A and 5B, solder 140 has been attached to contact pad 120A of structure 110A, and is being attached to pad 120B of structure 110B to electrically connect the pads together. The attachment to pad 120A was made by the method of FIGS. 4A-4B (the squeeze-out is shown at 520A), but other methods including prior art methods could be used instead. As shown in FIG. 5A, the solder ball's region 510B opposite to pad 120A is melted without melting the rest of the solder. Structures 110A and 110B are arranged so that the region 510B physically contacts the pad 120B. The heating energy (e.g. laser or other types described above) is supplied to region 510B before and/or after the region 510B is placed on pad 120B. Region 510B is cooled and re-solidified to form the attachment. Squeeze-out 520B can be formed at the solder junction with pad 120B. Squeeze-out 520B may have the same shape (continuous lateral protrusion on all sides) and dimensions as given above for squeeze-out 520 of FIGS. 4B-4C. Squeeze-out 520B may or may not have the same shape and dimensions as squeeze-out 520A.

Figure 6A:
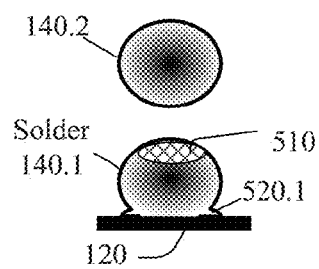
Figure 6B:
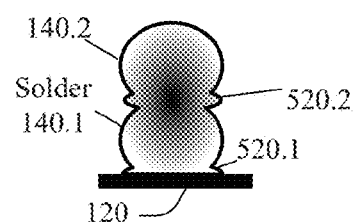

In the example of FIGS. 6A, 6B, the partial melting (i.e. melting less than all the solder of a solder ball) is used to form a solder stack. First, solder ball 140.1 is attached to pad 120 of a structure (not shown) such as described above in connection with FIG. 4A. In this example, the attachment to pad 120 was made by the method of FIGS. 4A-4B (the squeeze-out is shown at 520.1), but prior art methods could be used instead. Then solder ball's region 510 facing away from pad 120 is melted without melting the rest of the solder. Unmelted solder ball 140.2 is placed on ball 140.1 so as to physically contact the region 510. Solder ball 140.2 is never melted except possibly for a trifling amount melted by the heat transfer from ball 140.1. The heating energy is supplied to region 510 before and/or after the placement of solder ball 140.2, by any heating source described above (e.g. laser or non-laser electromagnetic source). Then region 510 is cooled and solidified to form the attachment. Squeeze-out 520.2 (FIG. 6B) can be formed at the junction of the two solder balls. Squeeze-out 520.2 may or may not have the same shape and dimensions as given above for squeeze-out 520 of FIGS. 4B-4C and may be irregular or regular in nature. Squeeze-out 520.2 may or may not have the same shape and dimensions as squeeze-out 520.1.

Figure 7:
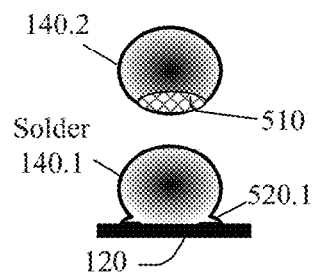

FIG. 7 shows a similar technique (partial melting) but the melting is performed on solder 140.2. The melted region 510 forms part of solder 140.2, the rest of solder 140.2 is unmelted. Solder 140.1 is also unmelted, except possibly for a trifling amount melted by heat transfer from ball 140.2. The ball 140.2 is placed so that its region 510 physically contacts the ball 140.1. The heating energy is supplied before and/or after the placement of ball 140.2 on ball 140.1 by any heating source described above. When solder re-solidifies, the structure is as in FIG. 6B.

Figure 8:
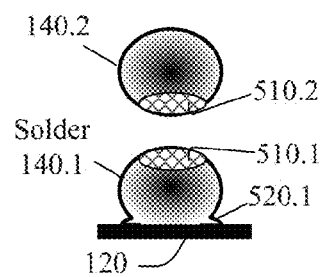

FIG. 8 shows a similar technique but with both solder balls 140.1, 140.2 being partially melted. The melted regions are shown respectively at 510.1, 510.2; the remaining solder is not melted. The heating energy is supplied before and/or after the placement of ball 140.2 on ball 140.1. When solder re-solidifies, the structure is as in FIG. 6B.

Figure 9:
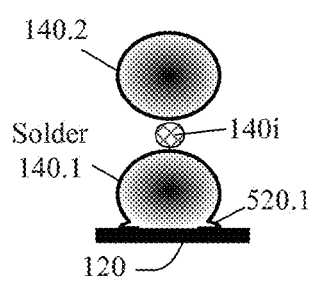

In FIG. 9, the attachment is formed using an intermediate solder ball 140i which is melted in its entirety (by any suitable heating source described above in connection with FIG. 4A). Solder balls 140.1 are 140.2 are unmelted except possibly for trifling amounts melted by heat transfer from the intermediate ball. In some embodiments, the pre-melted size (diameter, or maximum dimension) and/or height of ball 140i is 1% to 100% of the smallest of the pre-melted sizes and/or heights of balls 140.1, 140.2; and/or the pre-melted volume of ball 140i is 1% to 100% of the smallest of the pre-melted volumes of balls 140.1, 140.2. These dimensions are not limiting. In some embodiments, ball 140i is melted only once during the attachment of ball 140.2 to 140.1. For example, in some embodiments, the melting heat is supplied to ball 140i before and/or after the placement of ball 140i on ball 140.1; while the ball 140i is still melted, the second ball 140.2 is placed on ball 140i. Then ball 140i is solidified by cooling. The final structure can be as in FIG. 6B, with the squeeze-out 520.2 formed by intermediate ball 140i.

In other embodiments, intermediate ball 140i is melted when attached to lower ball 140.1, then the intermediate ball is solidified, and then is melted again to attach ball 140.2. The balls 140.1, 140.2 are not melted except possibly at and/or near the junction with ball 140i as noted above.

Figure 10:
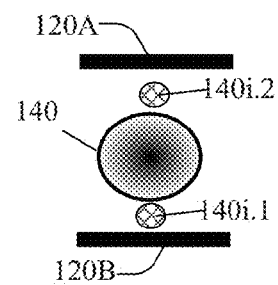

The method of FIG. 9 can be used to connect a solder ball 140 to a contact pad, as illustrated schematically in FIG. 10 (solder ball 140 is connected to pad 120A by intermediate ball 140i.1, and then connected to pad 120B by intermediate ball 140i.2; the final structure is as in FIG. 5B).

Any one or more of solder balls 140, 140i may have a non-solder central core 140C (FIGS. 11A, 11B) coated by solder shell 140S. FIGS. 11A and 11B illustrate the use of such balls in the process of FIGS. 6A, 6B. After the attachment (FIG. 11B), the cores 140C may or may not touch each other. The cores 140C are not generally melted, i.e. regions 510 are generally restricted to solder shells 140S; if such a ball is used as an intermediate ball 140i (FIGS. 9-10), only the solder shell 140S is melted (possibly the entire shell is melted). Core 140C does not significantly melt in this process; for example, core 140C can be a metal (e.g. copper or nickel) having a higher melting temperature than shell 140S, or the core 140C can be a polymer or an insulating material, e.g. polyimide; while the shell 140S can be a material having a melting temperature below 400° C. (e.g. a tin-based solder or indium), and so forth.

The methods described above can be used to form a conductive connection as a stack of any number of balls. The methods described above can be combined with other methods, e.g. prior art methods; for example, in the same stack, one or more balls can be attached by a method or methods according to some embodiments of the present invention, while one or more other balls can be attached by a prior art method or methods. The connection height is more stable. For example, if a solder stack is made using partial melting of solder balls, and the pre-melted height of each region 510 of each ball 140 is less than 50% of the height of the ball, then the stack height will be more than 50% of the sum of the pre-melted heights of the balls. Likewise, if a sequence of solder or non-solder balls 140 is attached to each other by intermediate solder balls 140i as in FIG. 9, and there is one intermediate solder ball 140i above (or below) each ball 140, and the pre-melted height of each intermediate ball 140i is less than 50% of the sum of the heights of balls 140, then the stack height will be more than 50% of the pre-melted height. Further, if the pre-melted height of each region 510 or each intermediate ball 140i is less than 25% of the heights of respective balls 140, then the final solder height is more than 75% of the pre-melted height. More generally, if the height of each region 510 or each ball 140i is less than X % of the heights of respective balls 140, then the stack height will be more than (100−X) % of the pre-melted height.

Advantageously, in some embodiments, all the solder used in balls 140 (i.e. solder 140 or 140i or 140S) in the entire stack can be made of the same material or of different materials having the same melting temperature. The melting regions are limited by limiting the spread of the electromagnetic radiation (e.g. by using laser and/or focused radiation).

Using the same material may simplify the manufacturing process. The invention is not limited to such embodiments however.

Structure-to-structure attachments can be performed by a method according to the present invention (e.g. as in FIG. 5B or 10) or a prior art method, e.g. by solder reflow in an oven. Of note, there could be multiple contact pads 120A (possibly hundreds or thousands) that must be attached to corresponding pads 120B, and it may be desirable to form such attachments simultaneously when the tips of all the solder connections are in the same plane (we use the term "solder connections" to include connections with non-solder components, e.g. with non-solder cores 140C or with non-solder balls joined by intermediate solder balls 140*i*). However, it may be inconvenient to perform simultaneous heating of multiple regions 510 or intermediate balls 140*i* by limited-spread electromagnetic radiation as in FIGS. 4A-11B due to the large radiation power that would have to be simultaneously delivered to regions 510 or balls 140*i*, possibly through one of the structures or through other intervening components (not shown). Therefore, in some embodiments, the structure-to-structure attachment is performed by solder reflow in an oven. To stabilize the solder height in this process, the solder can be locked in a solder locking layer 1210 (FIG. 12A) before the oven reflow. Solder locking layer 1210 (typically dielectric) exposes the tops of solder connections 140 but laterally surrounds and encapsulates the remaining solder of each solder connection so as to maintain the solder shape (and height) during the reflow at the stage of FIG. 12B. (In the example of FIGS. 12A-12B, the solder connections are as in FIG. 6B, but the technique can be used with other types of connections described above). Solder locking layer 1210 is formed at temperatures that do not allow the solder 140 to melt. In some embodiments, solder locking layer 1210 is a molded compound (i.e. a cured molding compound), typically dielectric, e.g. epoxy resin, formed by conventional techniques, e.g. transfer or compression molding, film-assist molding, or strip molding. Solder locking layer 1210 initially encapsulates the entire solder 140, and possibly (but not necessarily) physically contacts the solder 140 on all sides (all around); but later the layer 1210 is "shaved", i.e. partially removed (e.g. by wet blasting using aluminum slurry or other chemicals, dry blasting, laser ablation, or other techniques) to expose the tops of solder stacks 210. See e.g. U.S. Pat. Nos. 6,838,637 and 6,635,209, both incorporated herein by reference.

During the structure-to-structure attachment, the solder is reflowed at a temperature that will not damage the solder locking layer 1210. For example, in some embodiments, the solder melting temperature is 217° C., the solder locking layer is a molded compound formed at temperatures not exceeding 120° C. to 200° C., and in the structure-to-structure attachment the solder is reflowed in an oven at 245° C. to 255° C. These examples are not limiting.

Figure 13:
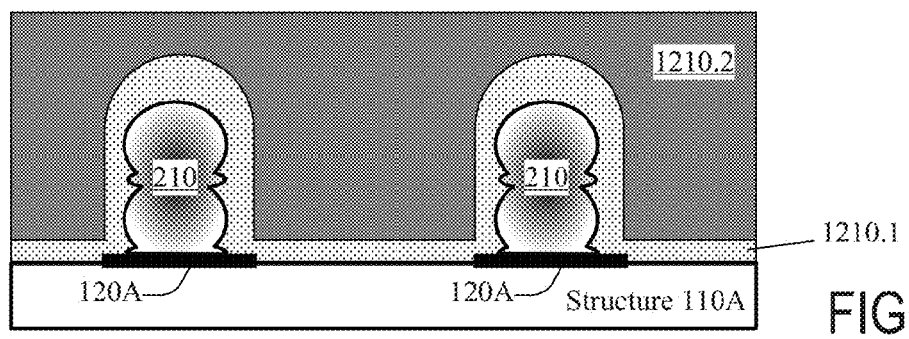

In some embodiments, solder locking layer 1210 includes a number of layers arranged to provide desired properties, e.g. a low combined dielectric constant. For example, in FIG. 13, solder locking layer 1210 includes layer 1210.1 and a later deposited molded compound 1210.2. In some embodiments, layer 1210.2 has a high dielectric constant (e.g. 4, 5, or greater); and layer 1210.1 has a lower dielectric constant (e.g. below 4, possibly below 3). Non-limiting examples of layer 1210.1 include silicon dioxide and parylene (parylene is described for example in U.S. Pat. No. 7,923,823 issued Apr. 12, 2011 to Mengel et al. and incorporated herein by reference; parylene's dielectric constant can be about 2.5).

Initially, each of layers 1210.1, 1210.2 covers the entire structure including the solder stacks. Then both layers are shaved to expose the solder stacks 210 and provide the structure of FIG. 12A. In some embodiments, both layers 1210.1, 1210.2 are shaved in the same process (e.g. by wet blasting or other techniques described above).

Figure 14A:
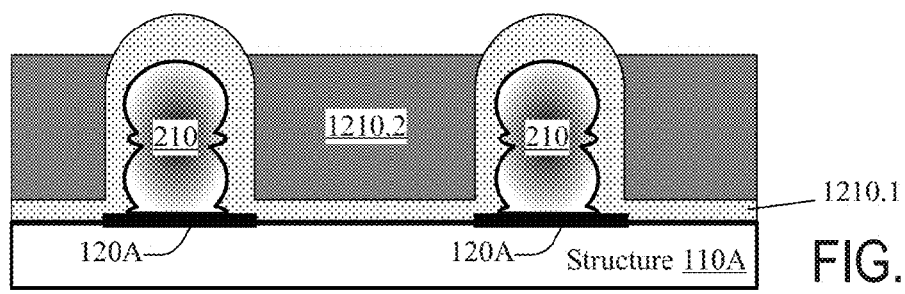
Figure 14B:
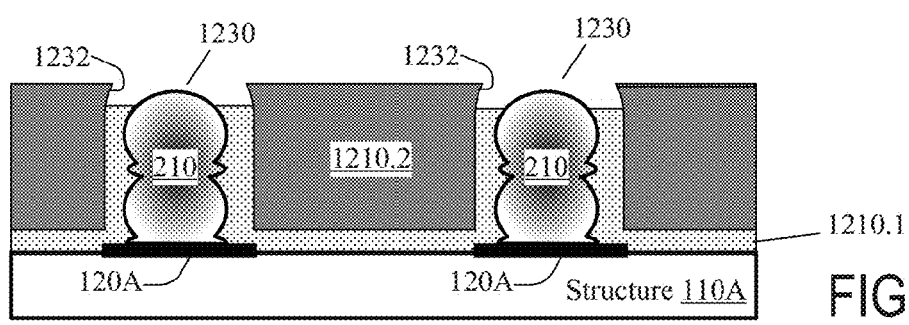

In another example (FIG. 14A), layer 1210.2 is shaved first selectively to layer 1210.1 to expose the top of layer 1210.1. Then layer 1210.1 is removed over stacks 210 selectively to layer 1210.2 (FIG. 14B). This process forms holes 1230 in molded compound 1210.2 over the solder stacks over structure 110A. In other words, solder stacks 210 are recessed at the top surface of molded compound 1210.2. As shown, stack 210 extends in a through-hole in layer 1210 and physically contacts the layer 1210; the top portion of this through-hole is the hole 1230 which has a concave sidewall 1232. The invention is not limited to any sidewall profile however.

Figure 14C:
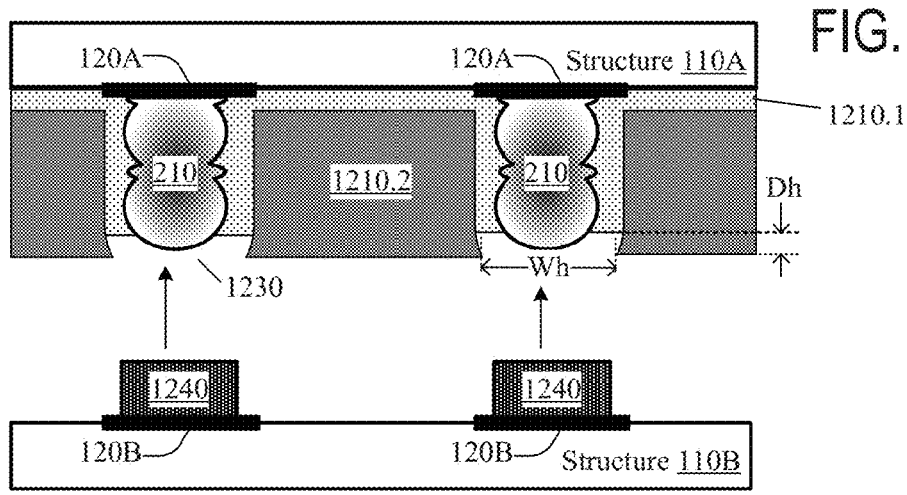

The structure is subsequently attached to structure 110B (FIG. 14C). In the example shown, structure 110B is provided with protruding contact posts 1240 on contacts 120B. Each post may be a solder ball, a solder stack, a copper post, or solder on a copper post, or of some other type. Posts 1240 are inserted in holes 1230 before or during the solder reflow. Holes 1230 help in aligning the posts 1240 with connections 210. Also, holes 1230 restrain the melted solder during the reflow, and thus reduce the possibility of electrical shorts between laterally adjacent contacts 120. In some embodiments, the pitch between contacts 120 can be reduced as a result. (In some embodiments, the molded layer 1210.2 does not wet the solder to further help restrain the solder's lateral flow.)

In some embodiments, the depth Dh of each hole 1230 is 0.5 to 30 microns, and preferably 2 to 10 microns; and the diameter Wh (when viewed from the top in FIG. 14B, i.e. from the bottom in FIG. 14C) is 1 to 200 microns, and preferably 2 to 100 microns. "Diameter" is the largest lateral dimension at the top of each hole; the holes may or may not be circular. These particulars are not limiting.

In some embodiments, due to holes 1230, the assembly is tolerant to non-uniform heights of posts 1240 as long as the shortest posts 1240 can reach the connections 210: indeed, the longer posts 1240 will displace more solder 210 during solder reflow, but the excess solder can be accommodated in holes 1230 around the posts 1240 if the holes 1230 are sufficiently wider than the posts. For the same reason, the assembly is tolerant to non-uniform heights of connections 210.

Figure 15:
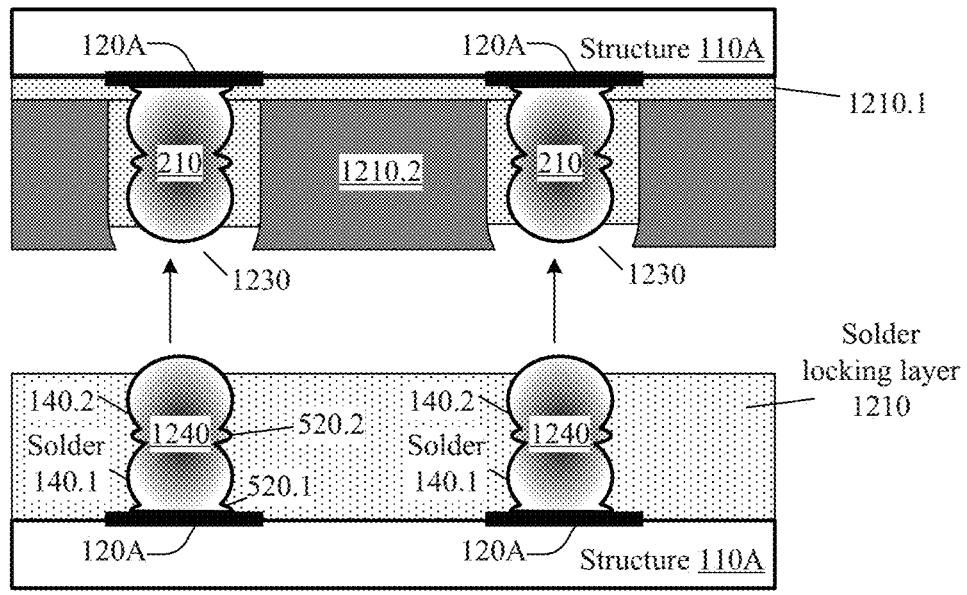

In some embodiments, protruding posts 1240 are solder connections made by a method described above. For example, they can be formed as in FIG. 12A: see FIG. 15. Thus, the protruding stacks (as in FIG. 12A) and the recessed stacks (as in FIG. 14B) can be made by similar processes, simplifying the required tooling and the bill of materials. Posts 1240 can also be other type, including bond wires described in U.S. Pat. No. 8,618,659 issued Dec. 31, 2013 to Sato et al., incorporated herein by reference.

If desired, structure 110B can be bonded to solder locking layer 1210.2 in areas surrounding the holes 1230. The bonding can be by any suitable method, e.g. adhesive (not shown). Spacers (not shown) can be inserted between the structure 110B and layer 1210.2 in the bonding area, and/or adhesive can serve as spacers.

The recessed solder connections of FIG. 14B can be made even if each solder connection has only one solder ball. Also, solder-coated balls can be used (as in FIG. 11B).

Figure 16A:
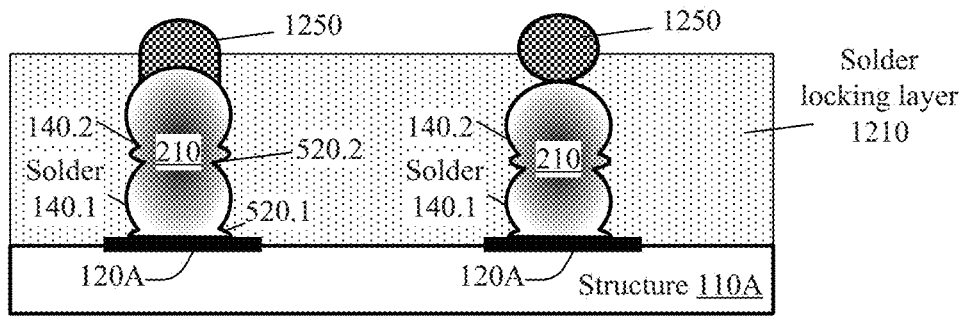

Another technique to form recessed solder connections is to use a sublimating material that sublimes before or during solder reflow. In some embodiments, vaporizable materials may be used in place of the sublimating material. In another embodiment sublimating and vaporizable materials may be combined in appropriate concentration in conjunction with the solder particles. (As used herein, "sublimation" means direct transition from solid to vapor; "evaporation" or "vaporization" means transition to vapor through the liquid phase.) In FIG. 16A, a ball of such a material 1250 is placed on top of each solder stack 210 before formation of solder locking layer 1210. In some embodiments, the balls of material 1250 are placed by jetting, with complete or partial melting of balls of material 1250 and/or underlying solder. The material 1250 is heated for a very short time, to a temperature not sufficient to sublimate or evaporate the material 1250 in the placement operation. (The term "sublimate or evaporate" implies that either one or both of sublimation and evaporation may be present at the same time.)

In FIG. 16A, ball of material 1250 on the right is spherical or almost spherical, but the ball of material on the left comes down around the sides of the solder stack 210 (around all sides in some embodiments). These details are not limiting.

Solder locking layer 1210 can be formed by any of the techniques described above or other techniques. In some embodiments, solder locking layer 1210 initially covers the balls of material 1250 but is later shaved to expose the balls of material 1250. In the embodiment shown, the shaved layer 1210 has a planar top surface but a non-planar surface is obtained in some embodiments. In some embodiments, layer 1210 has holes 1230 as in FIG. 14B, and have balls of material 1250 recessed in the respective holes, and these holes are enlarged by subsequent sublimation or evaporation of material 1250 as described below.

Figure 16B:
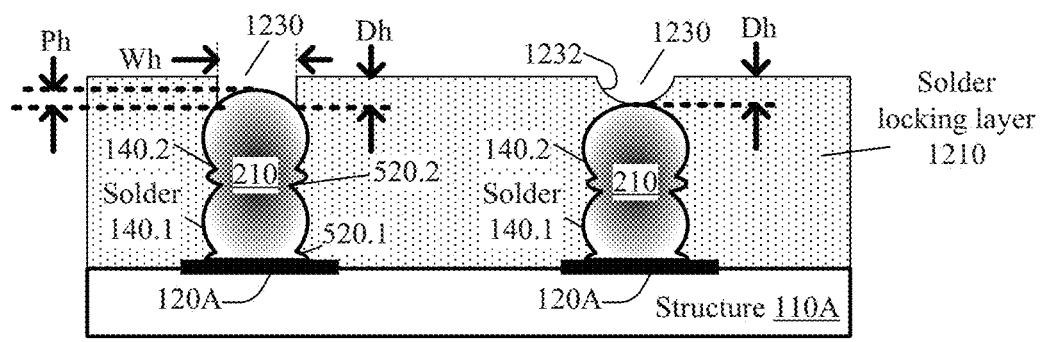

After exposure of balls of material 1250, the balls of material 1250 are sublimated or evaporated in a heating operation to provide (or enlarge) the holes 1230 (FIG. 16B). The sublimation can be enhanced by performing the heating operation in vacuum environment (e.g. 70 kPa or even higher vacuum). Alternatively or in addition, the evaporation can be enhanced by elevated temperatures (e.g. above 150° C.; suitable temperatures may be lower if vacuum is used.) In some embodiments, the heating operation is performed in vacuum environment in reducing ambient. The solder may or may not be melted during the sublimation or evaporation step (i.e. the heating operation). In some embodiments, the heating operation is performed in an oven during or immediately before the structure-to-structure attachment (see FIG. 14C), i.e. during solder reflow. Sidewall 1232 of each hole 1230 may be concave; the sidewall completely laterally surrounds the connection. The invention is not limited to a particular sidewall profile.

Each hole 1230 is a top portion of the through-hole in which the layer 1210 physically contacts the connection 210. In some embodiments, each ball of material 1250 is 1 to 300 microns and preferably 3 to 100 microns in diameter; the underlying connections 210 may vary from 2 to 300 microns and preferably from 3 to 150 microns in diameter Wh (when viewed from the top); an exemplary depth Dh of each hole 1230 is 2 to 80% of the diameter of the corresponding connection 210, and the hole's diameter at the top is 5 to 80% of the diameter of the corresponding connection 210. In the left hole in FIG. 16B, the connection 210 protrudes upward at the bottom of hole 1230. In some embodiments, the height Ph of this upward protrusion is 0.1 to 50% of the height of the connection 210, and preferably 5 to 30%. These particulars are not limiting.

In some embodiments, the connections 210 are made of a non-solder material; e.g. they can be copper or nickel posts.

Material 1250 can be any material consistent with its desired use as described above. Thus, in some embodiments, material 1250 is solid at room temperature, and can be softened by heat when the ball of material 1250 is placed on the underlying surface (i.e. on connection 210) to reliably adhere to the top surface of connection 210 during the placement and even after cooling. Material 1250 can be chosen to also adhere well to native oxides if any that may form on the top surface of connection 210. In some embodiments, when ball of material 1250 is being placed on connection 210, good adhesion between material 1250 and connection 210 is obtained by softening the material 1250 at a temperature below the melting temperature of the top surface of connection 210. In some embodiments, the softening can be performed by electromagnetic radiation, e.g. laser, that will not damage other parts of the structure. In some embodiments, the bottom portion of material 1250 is softened while the top portion is not softened. In some embodiments, the top portion of connection 210 is softened or melted to perform the placement.

Material 1250 can sublimate at suitable temperatures as described above. Exemplary sublimatable materials include waxes; high-molecular-weight polyethylene glycols (PEGs); polyethylene oxides (PEOs); and polyoxyethylene-polypropylene block copolymers. The molecular weights of these classes of materials may vary between 100 and 8000000. In some embodiments, the waxes and the PEG or PEO are combined. In another example, apart from paraffinic waxes, terpenoids may be used such as camphor 1,7,7-Trimethylbicyclo[2.2.1]heptan-2-one, camphor-10-sulfonic acid and their various analogues and related moieties may be used. These materials are suitable for many compositions of connections 210 including solder and non-solder compositions that include tin, lead, copper, nickel, silver, gold, platinum, and their combinations, and other materials.

Figure 17A:
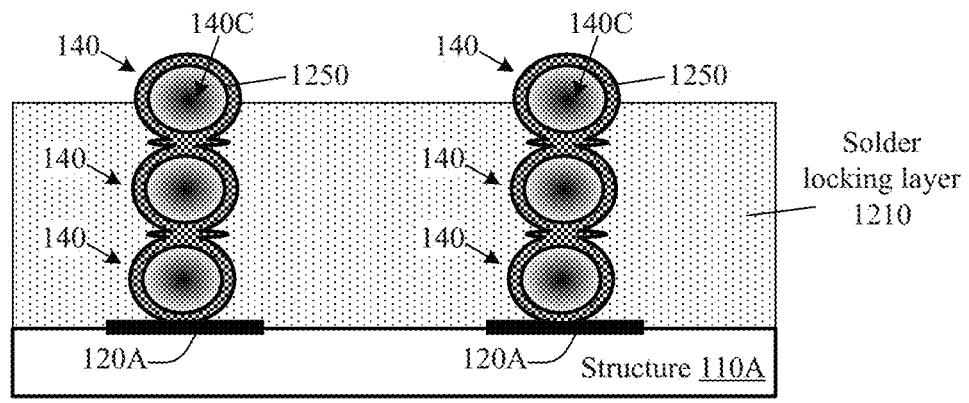
Figure 17B:
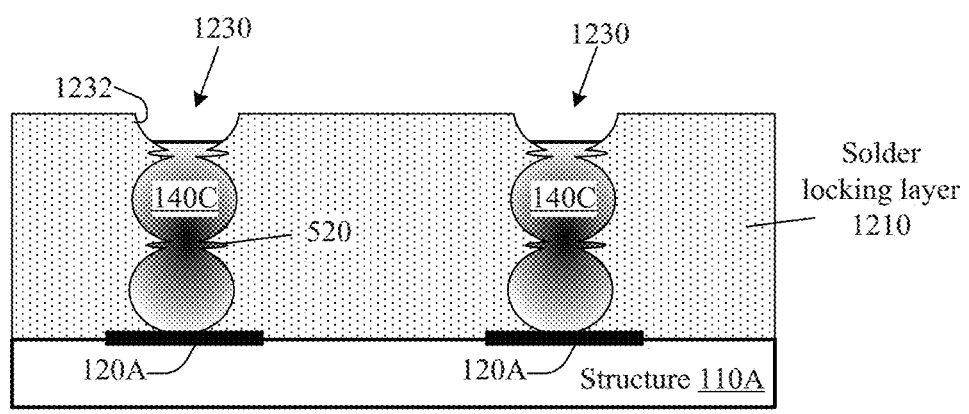

FIGS. 17A and 17B illustrate another embodiment in which the material 1250 is included in each ball 140 in the stacks. More particularly, each ball 140 has the following structure: solder core 140C coated with material 1250. Exemplary thickness of coating material 1250 on each ball is 1 to 5 microns for the core 140C having any diameter described above for balls 140 and 140i, but these dimensions are not limiting. The coating of material 1250 can be formed by any suitable technique, e.g. by spraying the cores 140C with a liquid which, when cured, provides the coatings of material 1250; or by dipping the cores 140C into a non-solid substance which, when cured, provides the coatings of material 1250. (In other embodiments, only some of balls 140 have this structure, while the other balls 140 may be of the type described above in relation to FIGS. 1A-16B.) Alternatively, or in addition, material 1250 may be mixed with the solder (e.g. inside a metallurgical solder network) in any one or more (possibly all) of balls 140. The placement of each ball 140 may be performed using the techniques described above or other techniques. For example, the placement may be performed by jetting with partial or complete melting or softening of material 1250, possibly with squeeze-out portions at the junctions of balls 140; in some embodiments, the solder portions of balls 140 (e.g. solder cores 140C) are not melted during the ball placement.

Then solder locking layer 1210 is formed as described above, to expose at least the top ball 140. Then the structure is heated, e.g. in an oven and preferably in vacuum, to sublimate or evaporate at least part (possibly all) of the material 1250; then the oven temperature is increased to reflow the solder 140C (FIG. 17B), and the solder 140C sinks, leaving the holes 1230. Material 1250 is chosen such that at, above, or below the solder melting temperature the material 1250 turns into vapor either by sublimation, i.e. directly from the solid phase, or via melting (i.e. from the liquid phase). The melted or unmelted material 1250 may first flow to the top through the melted solder and then turn into vapor. Thus in some embodiments, the material 1250 has a lower density than solder 140C. An exemplary density of material 1250 is 0.6 to 3 kg/cm$^3$. In some embodiments, the melted or unmelted material 1250 turns into vapor without first flowing to the top. As noted above, in some embodiments, the sublimation temperature of material 1250 is lower than the melting point of the solder 140C.

Material 1250 may or may not be electrically insulating, but the resulting solder connection is conductive because all or substantially all material 1250 is gone. In some embodiments, some material 1250 remains in the final structure, in amounts that do not impede electrically functionality of the final structure (possibly do not noticeably change the resistance of the solder connection).

Suitable materials 1250 are those that can function as described above. In particular, in some embodiments, material 1250 adheres well to core 140C, forming a coating of a predictable size. When heated to a suitable temperature, material 1250 of top ball 140 adheres to material 1250 of the ball immediately below, and adhesion remains good after cooling. In some embodiments, only one of the two balls is heated. In those embodiments in which a ball with material 1250 is placed on a lower ball's or contact pad's surface not covered by material 1250 (e.g. on an all-solder ball), the material 1250 is chosen to provide good adhesion with the surface of the lower ball. In some embodiments, good adhesion is obtained even in the presence of oxides on the ball being placed and the surface on which the ball is placed if such oxides can form before or during placement.

Suitable materials include the waxes, polyhydric alcohols, PEO, terpenoids, and other materials described above in connection with FIG. 16A. At least some of these materials have the suitably low density as described above, they can be made suitably soft for placement at a temperature below the melting temperature of many solders (e.g. at 120° C. for some materials), they can have low densities as specified above, and they can sublimate at fairly low temperatures, between 60 to 200° C. in some examples; such sublimation temperatures are suitable for use with solders having a melting point above 200° C. for example.

FIG. 17B shows squeeze-out portions 520 which are areas initially filled by material 1250 but later filled by solder 140C. The squeeze-outs may or may not be present.

Sidewall 1232 of layer 1210 at each hole 1230 may be concave; the sidewall completely laterally surrounds the connection. Each hole 1230 is a top portion of the through-hole in which the layer 1210 physically contacts the connection 210. The invention is not limited to such particulars.

In some embodiments, the amount of material 1250 is chosen to provide desired dimensions for the holes 1230. As the solder sinks during sublimation or evaporation of material 1250, some of the solder may remain on the sidewalls of solder locking layer 1210 to narrow the holes 1230. This narrowing can be minimal if the layer 1210 is not wetted by the solder. An exemplary depth of each hole 1230 is 1 to 200 microns and preferably 3 to 30 microns, and the hole's diameter at the top is 5 to 80% of the diameter of the corresponding connection 210. In each connection 210, the amount of material 1250 is about 3 to 50% by volume and preferably 5 to 25% by volume relative to the connection 210. These particulars are not limiting.

Figure 18:
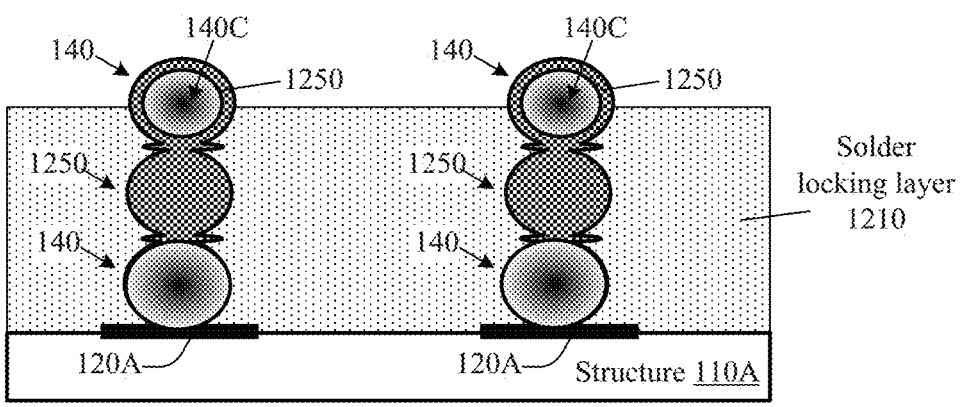

A single stack for a connection 210 may include any combination of balls 140 and 1250 of FIGS. 4A-17A. For example, in FIG. 18, each stack combines solder balls 140 as in FIG. 17A with a ball 1250 as in FIG. 16A. The top ball 140 includes sublimatable or vaporizable coating 1250, and the middle ball 1250 is entirely sublimatable or vaporizable. Different sublimatable or vaporizable compounds or compositions can be used in different balls in the same stack (the term "composition" as used herein includes a pure compound). Material 1250 of all the balls is later sublimated or evaporated as described above, leaving holes 1230 as in FIG. 16B or 17B. Exemplary profiles and dimensions of holes 1230 and sidewalls 1232 can be as described above, but these profiles and dimensions are not limiting.

Of note, in some embodiments, some of the balls 140 are not melted. For example, referring to FIG. 10, if a ball 140 is attached to adjacent contact pads or balls by intermediate solder 140i, then the ball 140 may be a high melting temperature material (possibly solder) or a non-melting material (such as a thermosetting polymer which decomposes at a high temperature rather than melt). The intermediate ball 140i can be made of material 1250 in some embodiments, the balls above and below (or the ball above and the contact pad below) are fused together when ball 140i sublimes or evaporates.

In some embodiments, the solder melting temperatures are such that even after the structure-to-structure attachment, all the connections can be undone by a conventional method, e.g. reflow in an oven, without damaging the structures. The oven reflow can be more convenient than the limited-spread radiation. The melting temperatures are under 450° C. in some embodiments.

Figure 19A:
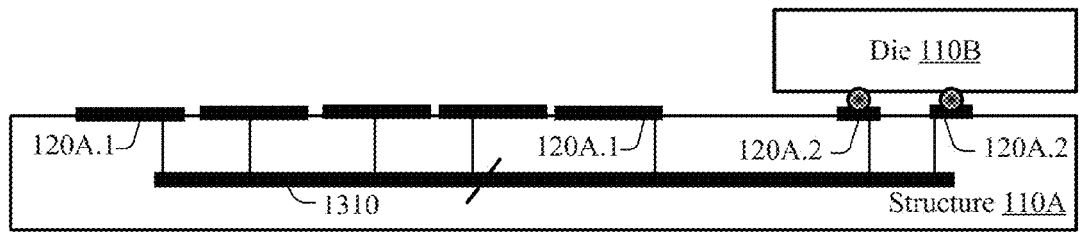
Figure 19B:
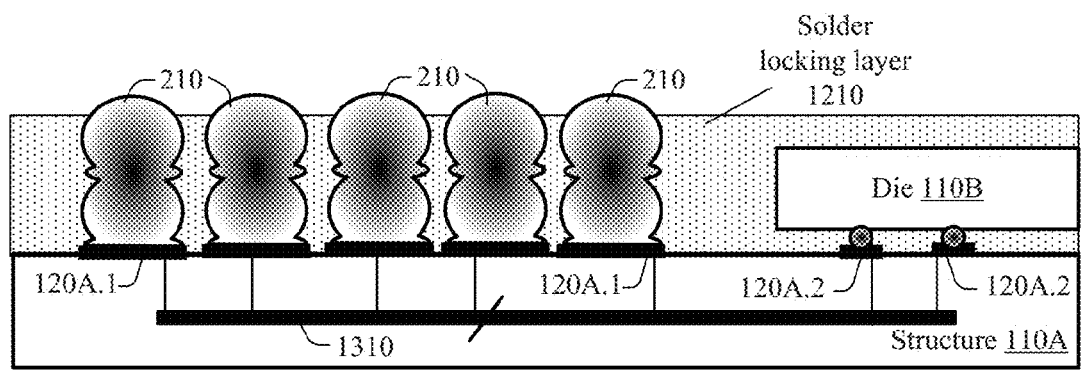

The attachment methods described above can be used in many packaging processes, and possible benefits are illustrates in FIGS. 19A-19B. In FIG. 19A, a structure 110A is a wiring substrate, e.g. an interposer made using silicon and/or metal and/or rigid and/or flexible insulator and/or other material. Structure 110A has contact pads 120A.1 and smaller contact pads 120A.2 which are interconnected by a network of conductive interconnects 1310 as needed. A die (e.g. a semiconductor integrated circuit, e.g. a silicon circuit) 110B is flip-chip connected to contact pads 120A.2. In exemplary embodiments, die 110B is 200 µm thick; the structure 110A has 5 rows of contact pads 120A.1 at 240 µm pitch. The die connection can be by solder, thermocompression, or other techniques, which may or may not use some embodiments of this invention.

The die can be optionally underfilled (the underfill is not shown).

Solder may or may not have been deposited (e.g. electroplated or evaporated or printed) on pads 120A.1 before the die attachment. Then stacks 210 (FIG. 19B) are formed on contact pads 120A.1 by any method described above. In this illustration, each stack 210 has two solder balls jetted and fused together by partial melting techniques. The pre-melted solder-ball diameter is 175 µm, and the solder stacks rise higher than die 110B. In some embodiments, more than two solder balls (and even more than three solder balls) may be fused to provide the 175 micron height. The invention is not limited to the number of solder balls in each stack or to any particular height.

The number and diameter of the solder balls can be chosen as needed. (In one example, the pre-melted diameter is 25 μm, and each solder stack has more than 10 solder balls.) In some embodiments, all the bottom solder balls in each stack are formed before any overlying ball; in other embodiments, the entire stacks 210 are formed sequentially one after another.

Then solder locking layer 1210 can be formed by strip molding or film assist molding for example. Wet blasting with aluminum slurry can be used to expose the solder stacks 210 at the top. In an exemplary embodiment with more than two solder balls per stack, the height-to-pitch ratio of the solder stacks can be 2:1.

Figure 20:
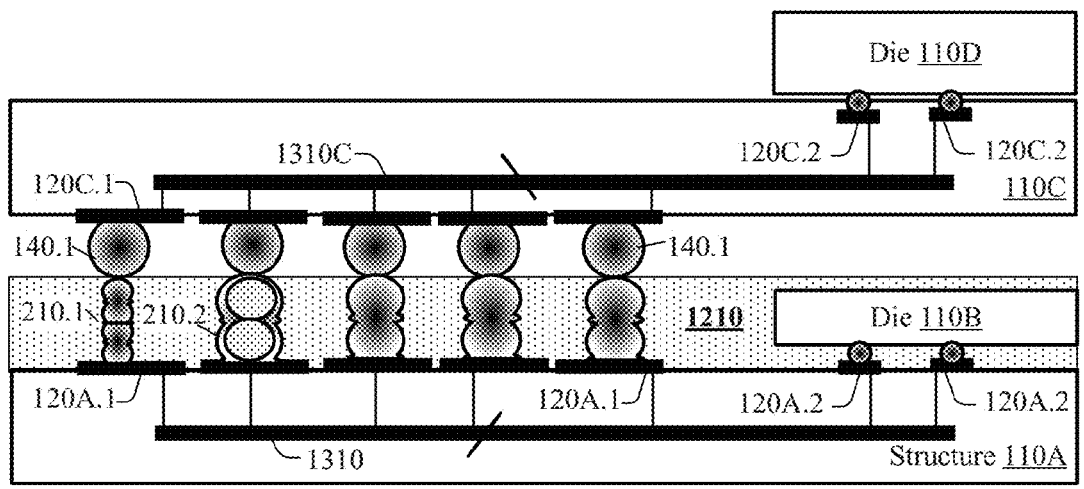

Another structure, e.g. an integrated circuit die or wafer or a packaging substrate or a package, can be attached to the tops of solder stacks 210. In the example of FIG. 20, the top structure includes a structure 110C (e.g. an integrated circuit or a wiring substrate) attached to an integrated circuit 110D formed as a die and flip-chip mounted on structure 110C. A molded compound (not shown) may then be provided to encapsulate the entire assembly on structure 110A. Structure 110C has contact pads 120C.2 attached to die 110D, and has contact pads 120C.1 bumped with solder balls 140.1 which are then soldered to stacks 210 formed on pads 120A.1 of structure 110A. Additionally or alternatively, posts or pins may be provided on the bottom of structure 110C for structural standoff between the structure 110C and the underlying package. In such an implementation, the posts or pins may be coated with solder 140.1. Moreover, the posts or pins may be configured to be inserted into some of the underlying solder stacks 210. When implemented with the techniques illustrated in FIGS. 14A through 18, such pins or posts may additionally assist with alignment of structure 110C to the underlying package.

In FIG. 20, solder 140.1 and solder stacks 210 were reflowed in an oven to attach the structure 110C to structure 110A; solder stacks 210 were constrained by solder locking encapsulant 1210 during the reflow. Interconnect lines 1310C in structure 110C connect the pads 120C.1 and the pads 120C.2 to each other as needed. In some embodiments, structure 110A includes a logic integrated circuit (e.g. a computer processor), and structure 110C includes a computer memory. This example is not limiting.

As illustrated, solder connections 210 may differ from each other: the leftmost connection 210.1 has small solder balls. The second stack 210.2 from the left has large solder-coated balls as in FIGS. 11A-11B (e.g. with a core made of copper or some other higher-melting-temperature material or a non-melting material, e.g. a cured polymer or an insulator). The remaining solder connections are made of large balls consisting entirely of solder. These examples are not limiting.

As noted above, use of the techniques described above in connection with FIGS. 4A-20 may increase the height-to-pitch ratio, which can be 0.8 or more per solder ball.

Figure 21A:
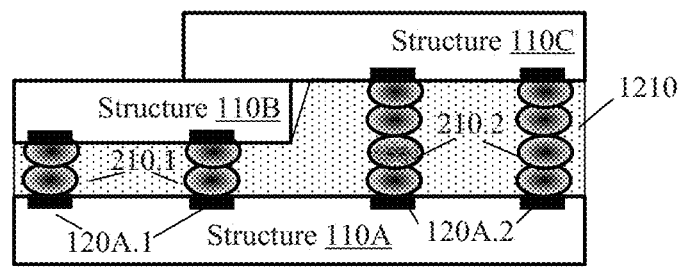

Some embodiments of the present invention facilitate manufacture of assemblies with different-length connections between structures. Such manufacturing capability is desirable to provide small size and short circuit paths in integrated circuit packages; see for example U.S. Pat. No. 8,618,659 issued Dec. 31, 2013 to Sato et al., incorporated herein by reference. An example package obtained in some embodiments of the present invention is shown in FIG. 21A. The package includes short connections 210.1 connecting a structure 110A to a structure 110B, and longer connections 210.2 connecting the structure 110A to a structure 110C. Each of structures 110A, 110B, 110C may be a packaged or unpackaged integrated circuit or a packaging substrate. Structure 110C may or may not be connected to structure 110B by additional connections. Each of such connections can be a solder ball, a solder stack, a solder wire, a wire bond (such as described in the aforementioned Sato et al. U.S. Pat. No. 8,618,659 or some other kind of wire). In particular, the connections can be as described above in relation to FIGS. 1A-20. These examples are not limiting.

Solder locking layer 1210 laterally surrounds each connection 210.1, 210.2. In some embodiments, solder locking layer 1210 is a molded layer (e.g. epoxy) made in a single molding operation in a specially designed mold. Alternatively, solder locking layer 1210 may be a combination of one or more thin films and a molded compound (such as 1210.1, 1210.2 in FIG. 14B); the molded compound laterally surrounds each short and long connection 210.1, 210.2; the molded layer is made in a single molding operation. In either case, the molded layer extends along the entire height of each connection 210 (except possibly near the contact pads). The molded layer may include an opening 1230 as described above in relation to FIGS. 14B-18.

Figure 21B:
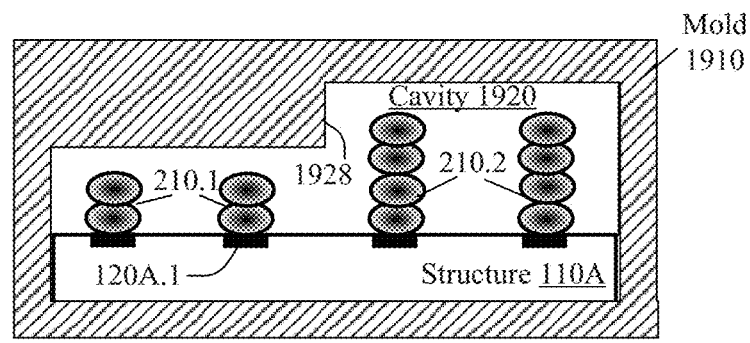
Figure 21C:
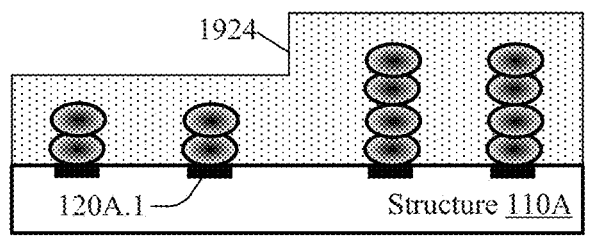
Figure 21D:
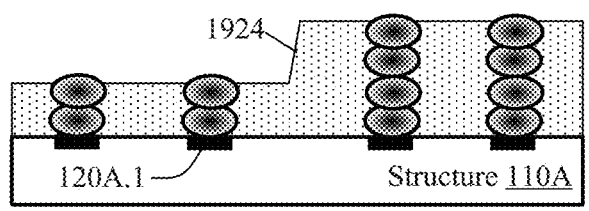

This structure can be fabricated as follows. First, the short connections 210.1 and long connections 210.2 are formed on respective contact pads 120A.1, 120A.2 (FIG. 21B), by solder jetting, printing, wire bonding or any other suitable method. Then the molded portion of solder locking layer 1210 is formed in mold 1910 (FIG. 21B), by transfer molding for example. (In the embodiment shown, the entire layer 1210 is formed in this molding operation; in other embodiments, thin-film layers are formed before the molding operation.) The molding cavity 1920 of mold 1910 is taller over solder connections 210.2 than over solder connections 210.1, to provide a stepped profile for layer 1210. A molding compound is injected into the cavity and cured. (Exemplary molding compounds include thermoplastic or thermosetting compounds, e.g. resins (e.g. epoxy resins).) The resulting structure, taken out of the cavity, is shown in FIG. 21C. At this stage, layer 1210 covers the connections 210. Of note, layer 1210 does not have any interfaces typically present in a molded layer having multiple layers formed by respective multiple molding operations (the interfaces that separate the molded layers made in different molding operations). Layer 1210 is then polished using possibly standard techniques described above (e.g. dry or wet blasting, etc.). See FIG. 21D. The polishing operation may attack the interface 1924 of layer 1210 between the high connections 210.2 and low connections 210.1. This interface is formed by the mold cavity interface 1928 (FIG. 21B) between the high and low connections. In some embodiments, interface 1928 is a vertical wall, or is slightly sloped for ease of structure ejection after the molding step; and therefore layer 1210 has a vertical or near vertical step at interface 1924, but this vertical step becomes less vertical during polishing, e.g. the 90° angle may increase to, say, 100° or to some other value depending on the process parameters such as the material of layer 1210, the dimensions of various portions of layer 1210, and on the polishing operation.

Then structures 110B, 110C have their contact pads attached to respective connections 210.1, 210.2 using suitable techniques, e.g. as in prior art, to provide the assembly of FIG. 21A.

This technique can be extended to connections of three or more different heights. For example, a structure may have an array of two-ball solder stacks 210, another array of four-ball solder stacks, and a still other array of six-ball solder stacks, with all the solder balls of the same size in each stack.

There may be additional arrays of still different connection heights of solder or non-solder connections. The molding cavity may correspondingly have three or more regions of different heights to create a corresponding stepped profile of molded layer 1210 in a single molding operation. All the connections can then be revealed at the top in a single polishing operation.

In solder stacks described above, balls 140 or 140*i* or 1250 do not have to be stacked on top of one another: the balls may extend laterally or in any other direction to provide suitable interconnections. Further, the connections can fork; e.g. a single ball 140 may be connected to two or more other balls, of the same or smaller size, and each of the other balls may be part of a chain of one or more balls, each chain providing a separate prong of the fork. The prongs may arise from the same contact pad (similar to the wires in the aforementioned Sato et al. patent). The balls may be deposited by printing methods. For example, wax balls 1250 can be deposited by solid ink printers.

Figure 22:
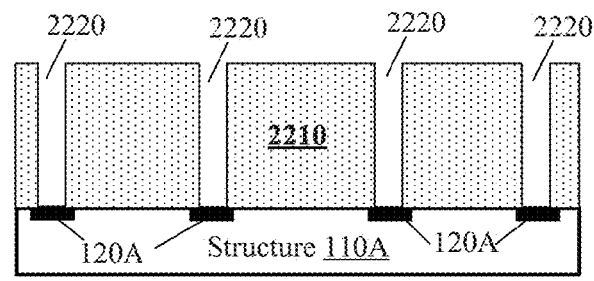

Embodiments described immediately below provide additional flexible methods for making connections 210 of the same or different heights, with or without holes like 1230, using sublimatable or vaporizable material such as 1250, by either jetting (possibly ink printing) or by less expensive screen printing. As shown in FIG. 22, in some embodiments, solder locking layer 2210 is formed on a structure 110A and is patterned to provide openings 2220 exposing the contact pads 120A on which the connections 210 will be formed. Solder locking layer 2210 will provide a stencil if screen printing is used. Layer 2210 can be any suitable material, and can be either sacrificial (temporary) or permanent. In some embodiments, layer 2210 is dielectric, possibly photoimageable polymer such as polyimide (formed by spin-coating or molding or some other technique), or inorganic dielectric such as silicon dioxide or silicon nitride (formed by chemical vapor deposition (CVD) or physical vapor deposition (PVD) or some other technique), or a combination of such layers. Openings 2220 can be formed photolithographically, or by laser drilling, or by a subtractive technique (forming a sacrificial layer (not shown) before layer 2210 at the location of openings 2220, then forming the layer 2210, and then removing the sacrificial layer), or possibly by other techniques.

Figure 23:
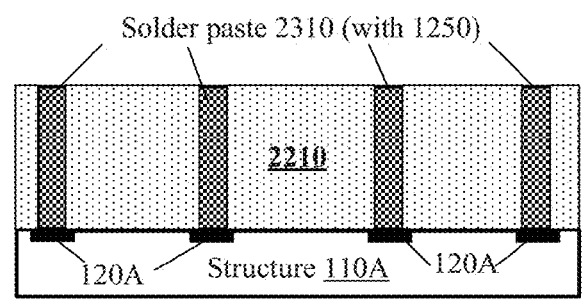

Solder paste 2310 (FIG. 23) is placed into openings 2220, possibly (but not necessarily) filling the openings. Solder paste 2310 can be a mixture of solder particles (solder powder) with sublimatable or vaporizable material 1250 such as described above, with possibly other additives such as fluxes and/or solvents or other liquids that reduce the viscosity or stiffness of the mixture to provide desired softness for the solder paste 2310 so that the solder paste could be placed into openings 2220 by a squeegee or other (possibly conventional) methods. Material 1250 can have the properties described above, but material 1250 does not have to be solid at room temperature. Rather, material 1250 may be liquid or semi-solid to turn the solder powder into a paste.

If needed, the solder paste is cured, e.g. in an oven, preferably in reducing ambient in vacuum, to evaporate the solvents if any and sublimate the other additives. Solder is then reflowed to settle on contact pads 120A at the bottom of openings 2220 (FIG. 24), thus forming connections 210. The curing step can be combined with the reflow. During the reflow, material 1250 turns into vapor, possibly flowing to the top of the solder paste and sublimating or by other mechanisms as described above in connection with FIGS. 17A-17B and 18. The solvents, fluxes, and/or other additives may also evaporate or may completely or partially remain in the solder, and may or may not be subsequently removed. The solder connections 210 may fill the bottom portions of openings 2220, but this is not necessary as the connections may include voids.

Reflow can be performed in an oven, or by laser, or using other energy sources as appropriate. In some embodiments, the reflow is performed in vacuum to speed up sublimation or evaporation of material 1250 and other additives (e.g. 70 kPa or higher vacuum).

The reflow operation forms holes 1230 at the top of openings 2220. The volume and depth of holes 1230 may depend on the composition of solder paste 2310 and solder locking layer 2210, the reflow process, and various dimensions. In some embodiments, the volume of each hole 1230 is 1% to 65% of the volume of corresponding opening 2220; the height of each hole 1230 is 2% to 65% of the height of corresponding opening 2220; and the volume of sublimatable or vaporizable material 1250 in solder paste 2310 is 0.5% to 40% of the solder paste volume. These examples are not limiting.

In some embodiments, material 2210 is chosen to be poorly wettable by the solder and/or the solder paste so as to allow the solder to sink to the bottom of openings 2220 without leaving solder filaments on the sidewalls of layer 2210. In some embodiments, layer 2210 may include a thin film formed on the sidewalls of openings 2220 at the stage of FIG. 22 (before solder paste deposition) to provide the desired wettability and other properties (e.g. to improve solder adhesion, provide a barrier layer against interdiffusion of solder with other elements of layer 2210, provide electrical insulation if layer 2210 includes conducive or semiconductor elements, provide compliance to accommodate thermal expansion, and/or possibly provide other properties).

Figure 24:
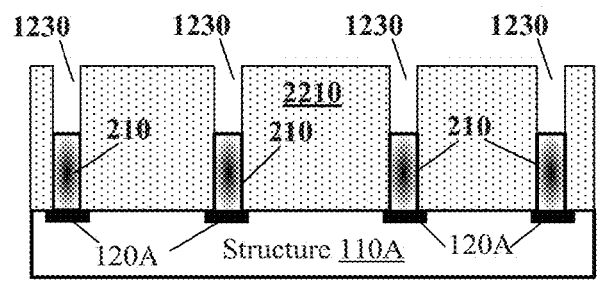

The structure of FIG. 24 can be attached to another structure or structures, for example as described above in connection with FIG. 14C with regard to attaching a structure 110B with protruding contact posts 1240 which can enter the holes 1230. Alternatively, at the stage of FIG. 24, layer 2210 can be removed, and other attachment methods can be used, for example as in FIG. 12B, or 19A-19B and 20, or according to other methods described above or possibly still other methods. In some embodiments, at the stage of FIG. 24, the structure is planarized to remove a portion of layer 2210 (e.g. by wet abrasive methods, and/or chemical mechanical polishing, and/or by mechanical milling, and/or other techniques) such that the top surface of layer 2210 becomes coplanar with the top surface of connections 210 in openings 2220. Then additional removal of layer 2210 may be performed to cause the connections 210 to protrude above the layer 2210. After the appropriate cleaning steps, other structure or devices may be attached to connections 210 as described earlier.

Figure 25:
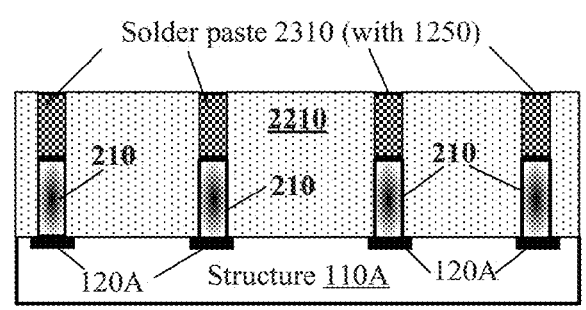
Figure 26:
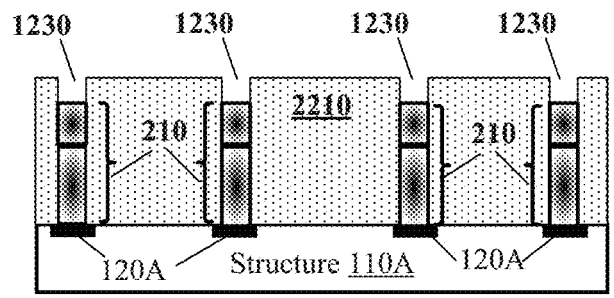

In some embodiments, solder paste application (as in FIG. 23) and solder reflow (FIG. 24) can be repeated to gradually grow the connections 210 to a desired height. This, in FIG. 25, additional solder paste 2310 with sublimatable material 1250 is applied to the structure of FIG. 24 to fill the openings 2220. Then the solder is reflowed to sublimate the additional sublimatable material 1250 (FIG. 26). As a result, connections 210 increase in height. This can be repeated any number of times (any number of iterations). In some embodiments, this technique provides more uniform height for solder connections 210: for example, if at the stage of FIG. 24 some openings 2220 have taller connections 210 than other openings, then at the stage of FIG. 25 the openings with taller connections will receive more of additional solder paste 2310, so at the stage of FIG. 26 the solder connections 210 will be more uniform in height. Further, each iteration applies only part of the entire volume of the solder paste, so the material 1250 is easier and faster to sublimate. Therefore, the solder connections 210 may have a higher density, i.e. less voids. (Voids may also be reduced by repeated reflows.) The higher density may improve the electrical conductivity of the connections. Also, the solder paste composition and amount may vary from one iteration to the next; for example, the top solder layer(s) of each connection 210 may include copper or silver or gold to reduce oxidation of the top surface of connections 210, and/or may include nickel or other barrier elements to impede contamination or corrosion of solder by substances in the environment or in other structures (such as in structure 110B or contact posts 1240 in FIG. 14C), while the bottom solder paste layer or layers may have less expensive solder compositions, having less or no metals such as copper or silver or gold or nickel. Further, in some embodiments, the bottom solder paste layer(s) are more flowable (less viscous) to facilitate solder deposition at the greater depth (at the bottom) in openings 2220. In some embodiments, the bottom solder paste layers do not include the sublimatable or vaporizable material 1250, only the top layer or layers include such material. In other embodiments, the bottom layers include a smaller percentage (by weight and/or volume) of sublimatable or vaporizable material 1250 than the top layers, and/or the bottom layers include the material 1250 which has a lower density and/or lower sublimation or evaporation temperature than the top layers. In some embodiments, the material 1250 in the bottom layers has a lower density measured as a percentage of the solder density than in the top layers, and/or has a lower sublimation or evaporation temperature measured as a temperature difference relative to the solder melting temperature than in the top layers. Other variations between different solder paste layers are possible.

In some embodiments, the bottom layer(s) are formed by techniques such as described for example with regard to FIGS. 2-18: e.g. solder balls can be jet-placed into opening 2220, and the solder balls may or may not have the material 1250. Each solder ball 140 at the bottom of an opening 2220 has a lateral diameter (i.e. the greatest lateral dimension) which is at least 50% of the smallest lateral dimension of opening 2220 (openings 2220 do not have to be cylindrical but may have other shapes). Then solder paste 2310 is deposited and reflowed as discussed above to form upper solder layers. The bottom balls 140 may or may not be reflowed before deposition of solder paste 2310.

The reverse is also possible: the bottom solder layers can be formed from solder paste 2310, and the top solder layers can be balls 140 as in FIGS. 2-18. In fact, any combination of such techniques is possible: for example, the bottom solder can be formed as in FIGS. 2-18, then an intermediate layer as in FIGS. 22-26, then more balls can be formed as in FIGS. 2-18, and so on.

Figure 27:
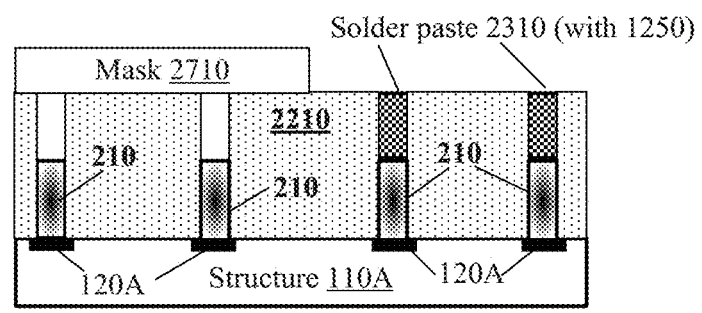

Connections 210 can vary in height in a controlled manner. For example, in some embodiments, after the stage of FIG. 24 or 26 (i.e. after forming the connections 210 of about the same height in all holes 2220), some of the holes are masked (with a mask 2710 in FIG. 27), and additional solder paste 2310 is deposited only in the unmasked holes. Then mask 2710 is removed and the solder is reflowed to provide taller connections 210 in only those holes which were not masked. See FIG. 28. This may be helpful for attachment to other structures with different types of connections. For example, in FIG. 29, a structure 110B has posts 1240 of different heights; the longer posts 1240 are attached to shorter connections 210, and the shorter posts 1240 are attached to longer connections 210. Matching the length of posts 1240 to the height of connections 210 reduces the amount of solder 210 displaced by the longer posts 1240, thus possibly preventing a short between the posts. Of note, the assembly is tolerant to slight non-uniformities in the heights of posts 1240 and connections 210 as explained above in connection with FIG. 14C.

Different connections 210 can also be attached to respective different structures.

Figure 28:
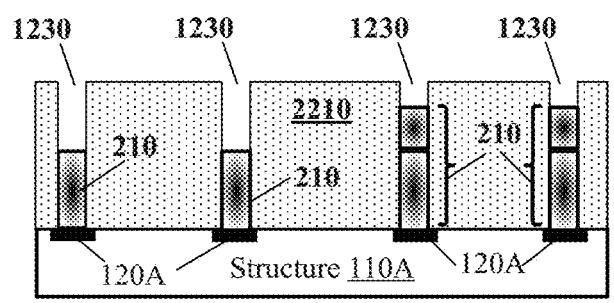
Figure 29:
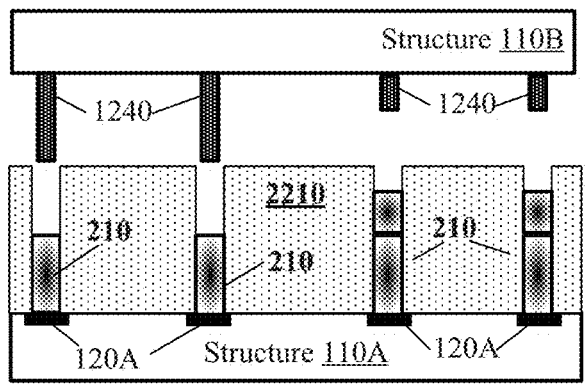
Figure 30:
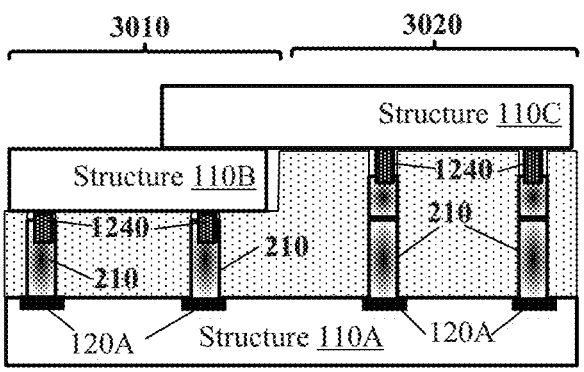

The flexibility of the methods described above is further demonstrated in FIG. 30: after the stage of FIG. 28 (i.e. formation of solder connections 210 of different heights), layer 2210 is etched by a masked etch (the mask is not shown) in an area 3010 containing the shorter connections 210. Another area 3020 with the longer connections 210 is covered by the mask and not etched. Then structure 110B is attached to the top surface of layer 2210 in area 3010: the posts 1240 of structure 110B are attached to the shorter connections 210. Then structure 110C is placed on top of layer 2210 in the remaining area 3020; structure 110C projects beyond this area over the structure 110C. (For example, the top surface of layer 2210 in area 3020 may be coplanar or higher than the top surface of structure 110B.) Structure 110C is bonded to the top surface of layer 2210 in area 3020, and possibly to the top surface of structure 110B. The contact posts 1240 of structure 110C are attached to the longer connections 210 in area 3020. Structure 110C may or may not have other connections (not shown) attached to connections on top of structure 110B. (Structures 110B and 110C may have contact pads (not shown), such as 120B in FIG. 14C, to which their respective posts 1240 are attached; the structures may contain circuitry connected to the contact pads.)

Figure 31:
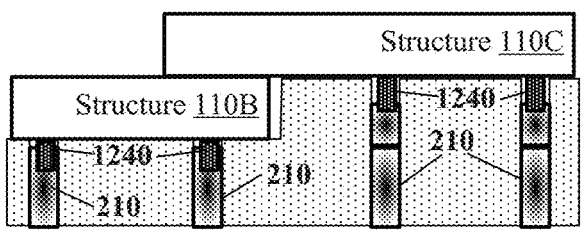

A further option is shown in FIG. 31: structure 110A can be removed (e.g. by grinding). In this embodiment, structure 110A is a sacrificial substrate, and contacts 120A can be omitted. Structure 110A was temporarily used to provide mechanical rigidity and heat dissipation during fabrication of layer 2210 and connections 210 and possibly other features; now structure 110A is being removed. Layer 2210 serves as an interposer, i.e. a substrate to which other integrated circuits or packages or temporary substrates are attached (such as 110B and 110C). While FIG. 31 illustrates the removal of substrate 110A for the assembly of FIG. 30, the same technique can be applied to other assemblies described above in connection with FIGS. 1A-29. In some embodiments, before removal of substrate 110A, the assembly is underfilled (by an underfill, not shown, introduced between the structures 110B, 110C, and layer 2210); as known in the art, the underfill can be deposited either before or after the attachment of structures 110B and 110C as known in the art. In addition, to strengthen the assembly, an encapsulant (not shown, e.g. a molding compound) can be formed over the structures 110B and 110C; and/or a handle wafer (not shown) can be attached over these structures. All of this can be done before removal of structure 110A.

Figure 32:
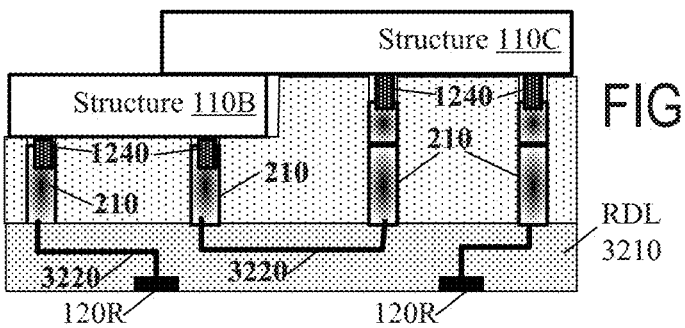

Removal of structure 110A exposes connections 210 on the bottom. If connections 210 may have voids on the bottom, then additional solder can optionally be deposited on the bottom to fill the voids; for example, the techniques of FIGS. 22-28 can be used. Then additional structures (not shown), e.g. integrated circuits or packages, can be attached to connections 210 on the bottom. In the example of FIG. 32, a redistribution layer (RDL) 3210 is formed on the bottom of layer 2210 to provide contact pads 120R on the bottom and to provide conductive lines 3220 connecting the contact pads to connections 210 and, possibly, to interconnect different connections 210 and, possibly, to interconnect different pads 120R. RDL 3210 may also include dielectric layers insulating the interconnects 3220 from each other and, if needed, from layer 2210. Additional structures (not shown) can have their contact pads attached to contact pads 120R.

Some embodiments of the present invention include structures and methods as defined by the following clauses and examples:

Clause 1 describes a manufacture comprising:
a first structure comprising one or more contact pads (for example, a structure 110A with contact pads 120A);
one or more electrically conductive connections (e.g. 210) each of which has a bottom attached to at least one contact pad and comprises solder; and
a first layer (e.g. 1210 or 2210) comprising a top surface and one or more through-holes in the top surface, each through-hole's sidewall being a dielectric sidewall, each through-hole containing at least a segment of a corresponding electrically conductive connection, the segment physically contacting the through-hole's dielectric sidewall, the electrically conductive connection being recessed in the through-hole at the top of the through-hole. For example, a recess can be a hole 1230.

Clause 2 describes the manufacture of clause 1 wherein at least one through-hole's sidewall has a concave portion at the top. For example, the concave portion can be 1232.

Clause 3 describes the manufacture of any preceding clause wherein at least one through-hole's sidewall has a concave portion below the top and has a convex portion immediately above the concave portion. One example is provided in FIGS. 12A, 14B: the concave portion below the top is the sidewall portion adjacent to ball 140.1; the convex portion immediately above is the inwardly-projecting sidewall portion between the ball 140.1 and the squeeze-out 520.

Clause 4 describes the manufacture of clause 1 or 2 wherein in at least one plane cross-section extending along at least one through-hole, the through-hole's sidewall is a straight line on each side of the through-hole. For example, in the vertical cross-section of FIG. 24, the sidewalls of each opening 2220 are straight lines on each side of the opening.

Clause 5 describes the manufacture of any preceding clause wherein at least one electrically conductive connection is attached to a conductive post (e.g. 1240) of a second structure (e.g. 110B), the conductive post being partially located in a top portion of the corresponding through-hole. See FIGS. 14C and 29-32 for some examples.

Clause 6 describes the manufacture of any preceding clause wherein each electrically conductive connection consists essentially of solder. (A connection may have trace amounts of other materials, e.g. fluxes, solvents, or material 1250, but these trace amounts do not affect the electrical conductivity of the connection.)

Clause 7 describes the manufacture of any preceding clause wherein the first layer is inorganic dielectric.

Clause 8 describes the manufacture of clause 1 wherein the one or more electrically conductive connections are a plurality of the electrically conductive connections, wherein at least two of the electrically conductive connections have different lengths.

Clause 9 describes the manufacture of clause 1 wherein the one or more electrically conductive connections are a plurality of the electrically conductive connections, wherein at least two of the electrically conductive connections have different heights in a view in which the electrically conductive connections are attached to one or more contact pads located at the same height. See FIGS. 21A and 28-32 for some examples.

Clause 10 describes the manufacture of claim 9 wherein the height-to-pitch ratio of the at least two of the electrically conductive connections is greater than 1.5.

Clause 11 describes the manufacture of claim 9 wherein the height-to-pitch ratio of the at least two of the electrically conductive connections is greater than 2.

Clause 12 describes a manufacture comprising one or more first components each of which comprises solder, wherein at least a segment of each component either:
comprises a solder core (e.g. 140C) coated with a material (1250) sublimatable or vaporizable when the solder is melted; or
consists of a material sublimatable or vaporizable when the solder is melted. See FIG. 16A for an example. Of note, different balls 140 or 1250 may have different sublimatable or vaporizable materials in the same structure.

Clause 13 describes the manufacture of clause 12 wherein each sublimatable or vaporizable material has a lower density at the solder's melting temperature than the solder.

Clause 14 describes a manufacturing method comprising:
obtaining a first structure (e.g. as in FIG. 16A or 17A or 18 or 23 or 25 or 27) comprising:
one or more first components each of which comprises solder and a material sublimatable or vaporizable when the solder is melted; and
a first layer (e.g. 1210 or 2210) comprising a top surface and one or more through-holes in the top surface, each through-hole's sidewall being a dielectric sidewall, each through-hole containing at least a segment of a corresponding first component;
heating each first component to sublimate or vaporize at least part of each sublimatable or vaporizable material and provide an electrically conductive connection at a location of each first component;
wherein in the heating operation at least part of each first component recedes down from the top surface to provide or increase a recess (e.g. 1230) in each through-hole at the top surface.

Clause 15 describes the method of clause 14 further comprising:
obtaining a second structure (e.g. 110B) with one or more protruding conductive posts (e.g. 1240); and
inserting each conductive post into a corresponding recess provided or increased in the heating operation, and forming a solder bond in each recess between the corresponding conductive post and the corresponding electrically conductive connection.

Clause 16 describes the method of clause 14 or 15 wherein before the heating operation, at least a segment of each first component either:
comprises a solder core coated with the sublimatable or vaporizable material; or
consists of the sublimatable or vaporizable material.

Clause 17 describes the method of clause 16 wherein obtaining the first structure comprises:
obtaining the first structure with the one or more first components but without the first layer; and then
forming the first layer.

Clause 18 describes the method of clause 14, 15, 16 or 17 wherein before the heating operation, at least a segment of each first component comprises solder paste which comprises solder powder and the sublimatable or vaporizable material; and obtaining the first structure comprises:
obtaining the first layer (e.g. 2210); and then
depositing the solder paste into each through-hole.

Clause 19 describes the method of clause 14, 15, 16, 17 or 18 wherein the first structure comprises an integrated circuit.

Clause 20 describes the method of clause 14, 15, 16, 17, 18, or 19 wherein in a top view, at least a segment of each electrically conductive connection is completely laterally surrounded by the first layer.

Clause 21 describes the method of clause 14, 15, 16, 17, 18, 19, or 20 wherein at the solder's melting temperature, the sublimatable or vaporizable material has a lower density than the solder.

Clause 22 describes a solder paste comprising:
solder powder; and
a first material in which the solder powder is dispersed to provide the solder paste, the first material comprising a sublimatable material.

Clause 23 describes the solder paste of clause 22 wherein the sublimatable material has a lower density at solder paste's melting temperature than the solder paste.

Clause 24 describes the solder paste of clause 22 wherein the sublimatable material comprising an organic material of a molecular weight of at least 100.

The invention is not limited to the embodiments described above. Other embodiments and variations are within the scope of the invention, as defined by the appended claims.

The invention claimed is:

1. A manufacture comprising:
a first structure comprising one or more contact pads;
one or more electrically conductive connections each of which has a bottom attached to at least one contact pad and comprises solder; and
a first layer comprising a top surface and one or more through-holes in the top surface, each through-hole's sidewall being a dielectric sidewall, each through-hole containing at least a segment of a corresponding electrically conductive connection, the segment physically contacting the through-hole's dielectric sidewall, the electrically conductive connection being recessed in the through-hole at the top of the through-hole;
wherein the first layer comprises:
a first dielectric sub-layer comprising, at each electrically conductive connection, an upward protrusion protruding above the first structure and laterally surrounding and physically contacting the electrically conductive connection; and
a second dielectric sub-layer overlaying the first dielectric sub-layer, the second dielectric sub-layer laterally surrounding each upward protrusion, the second dielectric sub-layer being a different material than the first dielectric sub-layer;
wherein each electrically conductive connection physically contacts the first dielectric sub-layer but not the second dielectric sub-layer; and
each electrically conductive connection and the first dielectric sub-layer are recessed in each through-hole.

2. The manufacture of claim 1 wherein at least one through-hole's sidewall has a concave portion at the top of the through-hole, the concave portion being a portion of a sidewall of the first dielectric sub-layer.

3. The manufacture of claim 1 wherein at least one through-hole's sidewall has a concave portion below the top of the through-hole and has a convex portion immediately above the concave portion.

4. The manufacture of claim 1 wherein in at least one plane cross-section extending along at least one through-hole, the through-hole's sidewall is a straight line on each side of the through-hole.

5. The manufacture of claim 1 wherein at least one electrically conductive connection is attached to a non-solder conductive post of a second structure, the conductive post being partially located in a top portion of the corresponding through-hole.

6. The manufacture of claim 1 wherein each electrically conductive connection consists essentially of solder.

7. The manufacture of claim 1 wherein the first sub-layer is inorganic dielectric.

8. The manufacture of claim 1 wherein the one or more electrically conductive connections are a plurality of the electrically conductive connections, wherein at least two of the electrically conductive connections have different lengths.

9. The manufacture of claim 1 wherein the one or more electrically conductive connections are a plurality of the electrically conductive connections, wherein at least two of the electrically conductive connections have different heights in a view in which the electrically conductive connections are attached to one or more contact pads located at the same height.

10. The manufacture of claim 9 wherein the height-to-pitch ratio of the at least two of the electrically conductive connections is greater than 1.5.

11. The manufacture of claim 9 wherein the height-to-pitch ratio of the at least two of the electrically conductive connections is greater than 2.

\* \* \* \* \*